(12) United States Patent
Sakuma

(10) Patent No.: US 12,022,733 B2
(45) Date of Patent: *Jun. 25, 2024

(54) ORGANIC ELECTROLUMINESCENCE DEVICE AND MONOAMINE COMPOUND FOR ORGANIC ELECTROLUMINESCENCE DEVICE

(71) Applicant: Samsung Display Co., Ltd., Yongin-si (KR)

(72) Inventor: Takao Sakuma, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/068,228

(22) Filed: Dec. 19, 2022

(65) Prior Publication Data
US 2023/0137318 A1 May 4, 2023

Related U.S. Application Data

(63) Continuation of application No. 16/735,545, filed on Jan. 6, 2020, now Pat. No. 11,557,735.

(30) Foreign Application Priority Data

Feb. 11, 2019 (KR) .................. 10-2019-0015550

(51) Int. Cl.
H10K 85/40 (2023.01)
H10K 85/60 (2023.01)
(Continued)

(52) U.S. Cl.
CPC ......... *H10K 85/6576* (2023.02); *H10K 85/40* (2023.02); *H10K 85/615* (2023.02);
(Continued)

(58) Field of Classification Search
None
See application file for complete search history.

(56) References Cited

U.S. PATENT DOCUMENTS 11,050,027 B2 6/2021 Shin et al.
2004/0209115 A1 10/2004 Thompson et al.
(Continued)

FOREIGN PATENT DOCUMENTS

CN 105154067 A 12/2015
CN 105778891 A 7/2016
(Continued)

OTHER PUBLICATIONS

Assadi, Naela, et al. "Variations of bistricyclic aromatic enes: mono-bridged tetraarylethene naphthologs." Structural Chemistry 26.1 (2015): 319-352. (Year: 2015).*

(Continued)

*Primary Examiner* — Robert S Loewe
(74) *Attorney, Agent, or Firm* — Lewis Roca Rothgerber Christie LLP

(57) ABSTRACT

An organic electroluminescence device of one or more embodiments includes a first electrode, a hole transport region on the first electrode, an emission layer on the hole transport region, an electron transport region on the emission layer and a second electrode on the electron transport (Continued)

region, wherein the hole transport region includes a monoamine compound represented by Formula 1, thereby showing high emission efficiency:

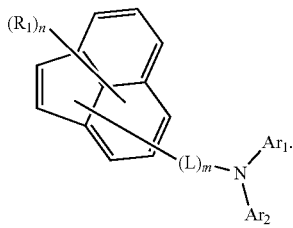

Formula 1

20 Claims, 2 Drawing Sheets

(51) Int. Cl.
H10K 50/11 (2023.01)
H10K 50/15 (2023.01)
H10K 50/16 (2023.01)

(52) U.S. Cl.
CPC ....... H10K 85/633 (2023.02); H10K 85/6574 (2023.02); H10K 50/11 (2023.02); H10K 50/15 (2023.02); H10K 50/16 (2023.02)

(56) References Cited

U.S. PATENT DOCUMENTS

| | | |
|---|---|---|
| 2011/0227054 A1 | 9/2011 | Pampuch et al. |
| 2015/0001494 A1 | 1/2015 | Kim et al. |
| 2015/0045529 A1 | 2/2015 | Stoessel et al. |
| 2015/0162542 A1 | 6/2015 | Ryu et al. |
| 2016/0035986 A1 | 2/2016 | Chung et al. |
| 2016/0072078 A1 | 3/2016 | Lee et al. |
| 2016/0240790 A1 | 8/2016 | Jang et al. |
| 2017/0294587 A1 | 10/2017 | Kim et al. |
| 2018/0019408 A1 | 1/2018 | Ko |
| 2018/0053898 A1 | 2/2018 | Kim et al. |
| 2019/0348609 A1* | 11/2019 | Yen .................... H10K 85/6572 |

FOREIGN PATENT DOCUMENTS

| | | | | |
|---|---|---|---|---|
| CN | 105906640 A | 8/2016 | | |
| CN | 107892650 A | 4/2018 | | |
| CN | 108178729 A | 6/2018 | | |
| EP | 2 980 182 A1 | 2/2016 | | |
| JP | 9-157643 A | 6/1997 | | |
| JP | 2007-42973 A | 2/2007 | | |
| JP | 2009-177125 A | 8/2009 | | |
| JP | 4677221 B2 | 4/2011 | | |
| JP | 2013-179198 A | 9/2013 | | |
| KR | 10-2011-0105285 A | 9/2011 | | |
| KR | 2011105285 A * | 9/2011 | ........... | C07D 251/02 |
| KR | 10-1530266 B1 | 6/2015 | | |
| WO | WO 2010/061315 A1 | 6/2010 | | |
| WO | WO 2013/139431 A1 | 9/2013 | | |
| WO | WO 2013/191409 A1 | 12/2013 | | |

OTHER PUBLICATIONS

Machine translation of Byun et al. (WO-2013191409), 19 pages. (Year: 2023).*
Machine translation of Je et al. (KR-2011105285), 21 pages. (Year: 2023).*
Periasamy et al. "Synthesis of diarylated aromatic hydrocarbons by dehydroxylation of diols using the titanium (IV) chloride and triethylamine reagent system." Synthesis 45.20 (2013): 2913-2918. (Year: 2013).*
Machine translation of CN-107892650, translation generated Jan. 2022, 14 pages. (Year: 2022).
Chinese Office action dated Jun. 10, 2023 issued in corresponding CN Application No. 202010085999.X, 7 pages.

* cited by examiner

ORGANIC ELECTROLUMINESCENCE DEVICE AND MONOAMINE COMPOUND FOR ORGANIC ELECTROLUMINESCENCE DEVICE

CROSS-REFERENCE TO RELATED APPLICATION(S)

This application is a continuation of and claims priority to and the benefit of U.S. patent application Ser. No. 16/735,545, filed on Jan. 6, 2020, which claims priority to and the benefit of Korean Patent Application No. 10-2019-0015550, filed on Feb. 11, 2019, the entire contents of all of which are incorporated herein by reference.

BACKGROUND

One or more aspects of embodiments of the present disclosure herein relate to an organic electroluminescence device and a monoamine compound for an organic electroluminescence device.

Recently, the development of an organic electroluminescence device as an image display device is being actively conducted. Different from a liquid crystal display device, the organic electroluminescence device is a self-luminescent display device in which holes and electrons injected from a first electrode and a second electrode recombine in an emission layer, and a light emission material including an organic compound in the emission layer emits light to attain (realize) display of images.

In the application of an organic electroluminescence device to a display device, the decrease of the driving voltage, and the increase of the emission efficiency and the life of the organic electroluminescence device are required (or desired), and development of materials for an organic electroluminescence device which are capable of stably attaining the required (or desired) features is being continuously required.

SUMMARY

One or more aspects of embodiments of the present disclosure are directed toward an organic electroluminescence device and a monoamine compound for an organic electroluminescence device, more particularly, an organic electroluminescence device having high efficiency and a monoamine compound included in a hole transport region of the organic electroluminescence device.

One or more embodiments of the inventive concept provide an organic electroluminescence device including a first electrode, a hole transport region on the first electrode, an emission layer on the hole transport region, an electron transport region on the emission layer, and a second electrode on the electron transport region, wherein the hole transport region includes a monoamine compound represented by the following Formula 1:

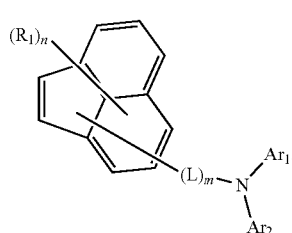

Formula 1

In Formula 1, $Ar_1$ and $Ar_2$ may each independently be a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring; L may be a substituted or unsubstituted arylene group of 6 to 30 carbon atoms for forming a ring, or a substituted or unsubstituted heteroarylene group of 2 to 30 carbon atoms for forming a ring, where L is not a polyacenylene having three or more rings; $R_1$ may be a hydrogen atom, a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring; "m" may be an integer of 0 to 5; and "n" may be an integer of 0 to 7.

In one or more embodiments, Formula 1 may be represented by the following Formula 2 or Formula 3:

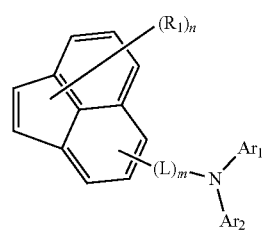

Formula 2

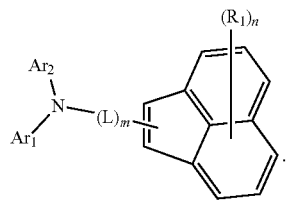

Formula 3

In Formula 2 and Formula 3, $Ar_1$, $Ar_2$, L, $R_1$, and "m" may be the same as defined in Formula 1, in Formula 2, "n" may be an integer of 0 to 5, and in Formula 3, "n" may be an integer of 0 to 6.

In one or more embodiments, in Formula 1, L may be a substituted or unsubstituted arylene group of 6 to 12 carbon atoms for forming a ring.

In one or more embodiments, in Formula 1, L may be a substituted or unsubstituted phenylene group.

In one or more embodiments, in Formula 1, at least one among $Ar_1$ and $Ar_2$ may be a substituted or unsubstituted aryl group of 10 to 20 carbon atoms for forming a ring, or a substituted or unsubstituted heteroaryl group of 10 to 20 carbon atoms for forming a ring.

In one or more embodiments, in Formula 1, at least one among $Ar_1$ and $Ar_2$ may be a condensed ring obtained by condensing three or more rings.

In one or more embodiments, Formula 1 may be represented by the following Formula 4:

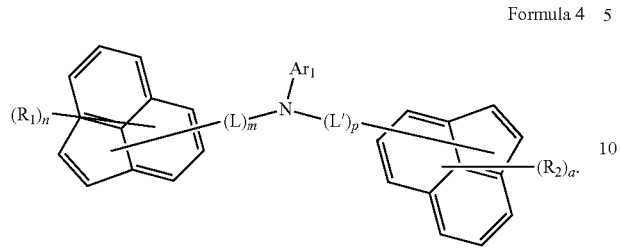

Formula 4

In Formula 4, L' may be a substituted or unsubstituted arylene group of 6 to 30 carbon atoms for forming a ring, or a substituted or unsubstituted heteroarylene group of 2 to 30 carbon atoms for forming a ring, where L' is not a polyacenylene having three or more rings; $R_2$ may be a hydrogen atom, a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring; "p" may be an integer of 0 to 5; "a" may be an integer of 0 to 7, and $Ar_1$, L, $R_1$, "m" and "n" may be the same as defined in Formula 1.

In one or more embodiments, Formula 1 may be represented by the following Formula 5:

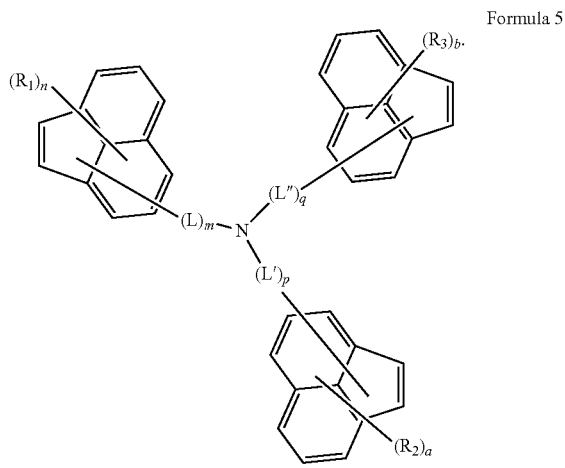

Formula 5

In Formula 5, L' and L" may each independently be a substituted or unsubstituted arylene group of 6 to 30 carbon atoms for forming a ring, or a substituted or unsubstituted heteroarylene group of 2 to 30 carbon atoms for forming a ring, where L' and L" are each independently not a polyacenylene having three or more rings; $R_2$ and $R_3$ may each independently be a hydrogen atom, a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring; "p" and "q" may each independently be an integer of 0 to 5; "a" and "b" may each independently be an integer of 0 to 7; and L, $R_1$, "m" and "n" may be the same as defined in Formula 1.

In one or more embodiments, Formula 1 may be represented by the following Formula 6:

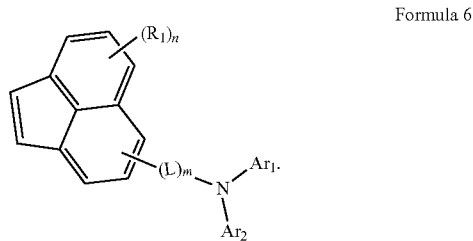

Formula 6

In Formula 6, $Ar_1$, $Ar_2$, L, $R_1$, and "m" may be the same as defined in Formula 1, and "n" may be an integer of 0 to 3.

In one or more embodiments, the hole transport region may include a hole injection layer on the first electrode, and a hole transport layer on the hole injection layer, wherein the hole transport layer may include the monoamine compound represented by Formula 1.

In one or more embodiments, the hole transport region may further include an electron blocking layer on the hole transport layer.

In one or more embodiments, the monoamine compound represented by Formula 1 may be at least one selected among the compounds collectively denoted as Compound Group 1.

In one or more embodiments of the inventive concept, there is provided a monoamine compound represented by Formula 1.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
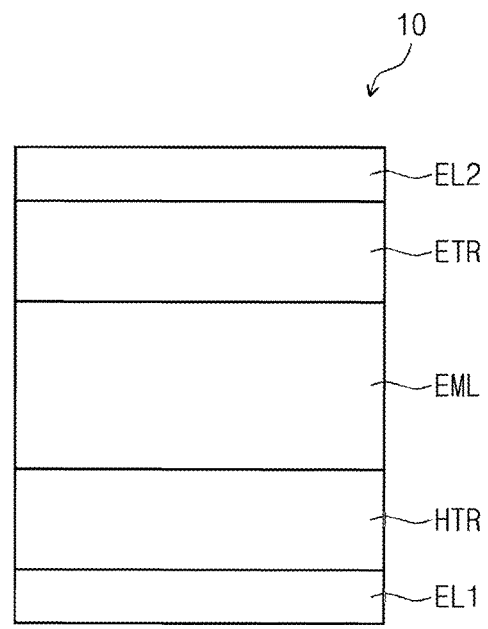
FIG. 1 is a cross-sectional view schematically illustrating an organic electroluminescence device according to an embodiment of the inventive concept.

The inventive concept may have various modifications and may be embodied in different forms, and example embodiments will be explained in more detail with reference to the accompanying drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

It will be further understood that the terms "comprises," "includes," "including," and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. It will also be understood that when a layer, a film, a region, a plate, etc. is referred to as being 'on' another part, it can be directly on the other part, or intervening parts may also be present. In contrast, when a layer, a film, a region, a plate, etc. is referred to as being 'directly on' another part, no intervening parts may be present.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention".

An organic electroluminescence device according to one or more embodiments of the inventive concept will be explained referring to FIGS. 1 to 3.

FIG. 1 is a cross-sectional view schematically illustrating an organic electroluminescence device according to one or more embodiments. FIG. 2 is a cross-sectional view schematically illustrating an organic electroluminescence device according to one or more embodiments. FIG. 3 is a cross-sectional view schematically illustrating an organic electroluminescence device according to one or more embodiments.

Figure 2:
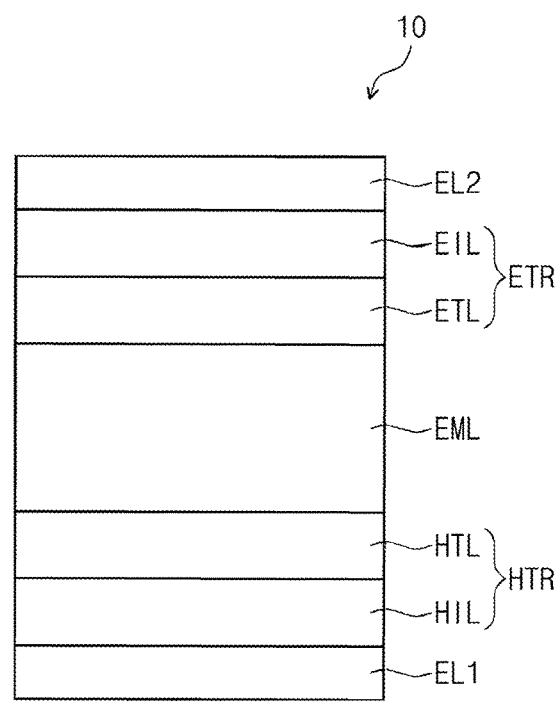
FIG. 2 is a cross-sectional view schematically illustrating an organic electroluminescence device according to an embodiment of the inventive concept.
Figure 3:
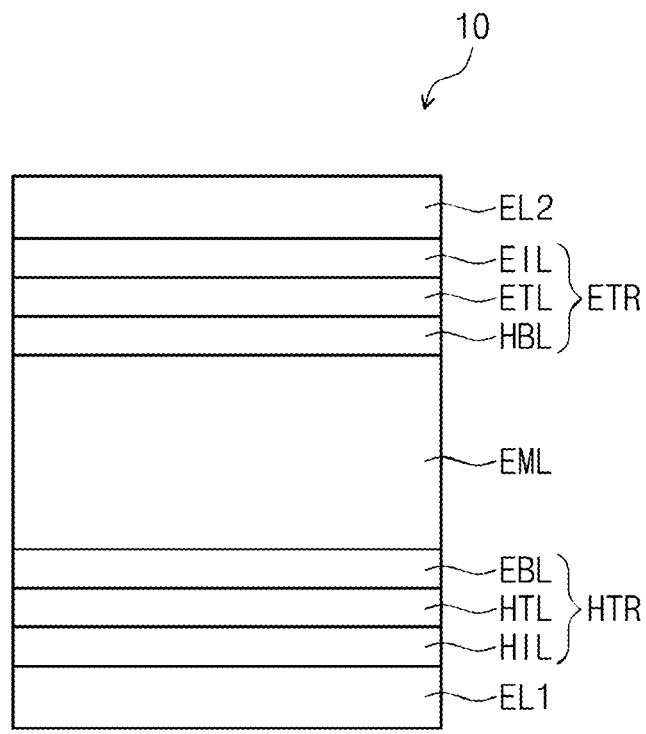
FIG. 3 is a cross-sectional view schematically illustrating an organic electroluminescence device according to an embodiment of the inventive concept.

Referring to FIG. 1 to FIG. 3, an organic electroluminescence device 10 according to one or more embodiments includes a first electrode EL1, a hole transport region HTR, an emission layer EML, an electron transport region ETR, and a second electrode EL2 laminated in this order.

The first electrode EL1 and the second electrode EL2 are oppositely disposed to each other (positioned to face each other), and a plurality of organic layers may be disposed between the first electrode EL1 and the second electrode EL2. The plurality of the organic layers may include a hole transport region HTR, an emission layer EML, and an electron transport region ETR. The organic electroluminescence device 10 of one or more embodiments includes a monoamine compound according to one or more embodiments of the inventive concept in the hole transport region HTR. Hereinafter, the monoamine compound according to one or more embodiments of the inventive concept will be explained in more detail, and then, each layer of the organic electroluminescence device 10 will be explained in more detail.

FIG. 2 shows the cross-sectional view of an organic electroluminescence device 10 of one or more embodiments, wherein a hole transport region HTR includes a hole injection layer HIL and a hole transport layer HTL, and an electron transport region ETR includes an electron injection layer EIL and an electron transport layer ETL. In addition, FIG. 3 shows the cross-sectional view of an organic electroluminescence device 10 of one or more embodiments, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL.

In the present description, the term "substituted or unsubstituted" may refer to an unsubstituted group or a group substituted with at least one substituent selected from a deuterium atom, a halogen atom, a cyano group, a nitro group, an amino group, a silyl group, a boron group, a phosphine oxide group, a phosphine sulfide group, an alkyl group, an alkenyl group, an aryl group, and a heterocyclic group. In addition, each of the substituents may be substituted or unsubstituted. For example, a biphenyl group may be interpreted as an aryl group or a phenyl group substituted with a phenyl group.

In the present description, non-limiting examples of the halogen atom may include a fluorine atom, a chlorine atom, a bromine atom and an iodine atom.

In the present description, the alkyl group may be a linear, branched or cyclic group. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present description, the aryl group may refer to a functional group or a substituent derived from an aromatic hydrocarbon ring. The aryl group may be a monocyclic aryl group or a polycyclic aryl group. The carbon number (i.e. the number of carbon atoms for forming a ring) in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the present description, the fluorenyl group may be substituted, and two substituents may be combined with each other to form a spiro structure. Examples of the substituted fluorenyl group are as follows, but embodiments of the inventive concept are not limited thereto:

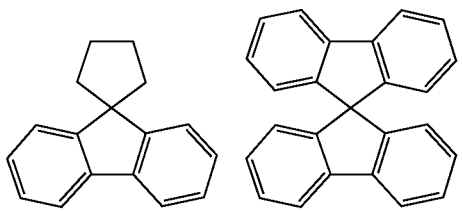

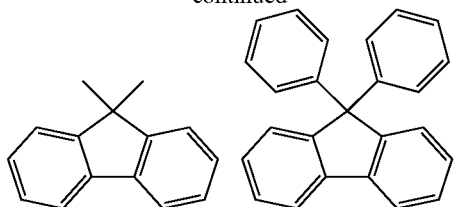

In the present description, the heteroaryl group may include one or more heteroatoms selected from among O, N, P, Si and S as a heteroatom for forming a ring. The carbon number for forming a ring of the heteroaryl group may be 2 to 30, or 2 to 20. The heteroaryl group may be monocyclic heteroaryl group or polycyclic heteroaryl group. The heteroaryl group may have, for example, a two-ring or a three-ring structure. Examples of the heteroaryl group may include thiophene, furan, pyrrole, imidazole, thiazole, oxazole, oxadiazole, triazole, pyridine, bipyridine, pyrimidine, triazine, acridine, pyridazine, pyrazine, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazole, phenothiazine, dibenzosilole, dibenzofuran, etc., without limitation.

In the present description, the silyl group includes an alkyl silyl group and an aryl silyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments of the inventive concept are not limited thereto.

In the present description, the explanation on the aryl group may be applied to the arylene group except that the arylene group is a divalent group.

In the present description, the explanation on the heteroaryl group may be applied to the heteroarylene group except that the heteroarylene group is a divalent group.

The monoamine compound according to one or more embodiments of the inventive concept is represented by the following Formula 1:

Formula 1

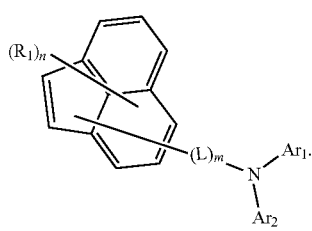

In Formula 1, $Ar_1$ and $Ar_2$ may each independently be a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring.

In Formula 1, L may be a substituted or unsubstituted arylene group of 6 to 30 carbon atoms for forming a ring, or a substituted or unsubstituted heteroarylene group of 2 to 30 carbon atoms for forming a ring. However, L in Formula 1 is not a polyacenylene (e.g., a divalent polyacene group) having three or more rings, such as anthracenylene and/or tetracenylene. If L is a polyacenylene having three or more rings, intermolecular energy transfer may be generated, and thus, the properties of the organic electroluminescence device may be deteriorated.

In Formula 1, $R_1$ may be a hydrogen atom, a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

In Formula 1, "m" may be an integer of 0 to 5. Meanwhile, if "m" is 2 or more, a plurality of L groups may be the same or different. When m is 0, acenaphthylene core and $NAr_1Ar_2$ are bonded by direct linkage (e.g., are directly bonded to each other).

In Formula 1, "n" may be an integer of 0 to 7. Meanwhile, if "n" is 2 or more, a plurality of $R_1$ groups may be the same or different.

The monoamine compound represented by Formula 1 may not be substituted with an amine group, except for including a nitrogen-containing aromatic ring.

In one or more embodiments, $R_1$ and an amine group in Formula 1 may be positioned on different rings of the acenaphthylene core. In this case, Formula 1 may be represented by the following Formula 2 or Formula 3:

Formula 2

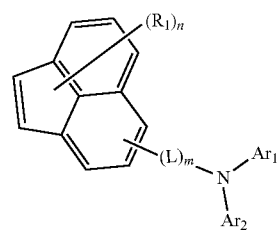

Formula 3

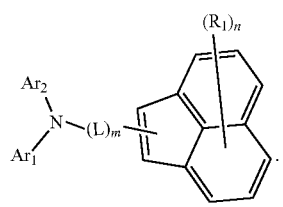

In Formula 2 and Formula 3, $Ar_1$, $Ar_2$, L, $R_1$, and "m" are the same as defined in Formula 1. In Formula 2, "n" may be an integer of 0 to 5. In Formula 3, "n" may be an integer of 0 to 6.

In Formula 1, "m" may be 1 and L may be a substituted or unsubstituted arylene group of 6 to 12 carbon atoms for forming a ring. L may be, for example, a substituted or unsubstituted phenylene group. However, one or more embodiments of the inventive concept is not limited thereto.

In Formula 1, at least one among $Ar_1$ and $Ar_2$ may be a substituted or unsubstituted aryl group of 10 to 20 carbon atoms for forming a ring, or a substituted or unsubstituted heteroaryl group of 10 to 20 carbon atoms for forming a ring. For example, at least one among $Ar_1$ and $Ar_2$ may be a substituted or unsubstituted biphenyl group, a substituted or unsubstituted naphthyl group, a substituted or unsubstituted fluorenyl group, a substituted or unsubstituted acenaphthylenyl group, a substituted or unsubstituted dibenzothiophenyl group, a substituted or unsubstituted dibenzofuranyl group, or a substituted or unsubstituted carbazolyl group. However, one or more embodiments of the inventive concept are not limited thereto.

In Formula 1, at least one among $Ar_1$ and $Ar_2$ may be a condensed ring structure obtained by condensing three or more rings.

In one or more embodiments, Formula 1 may be represented by the following Formula 4:

Formula 4

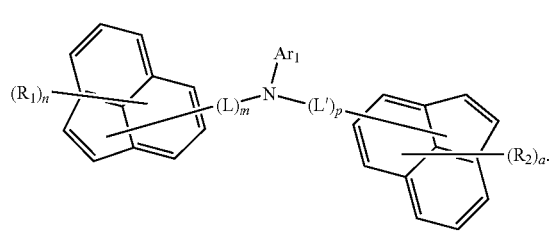

In Formula 4, L' may be a substituted or unsubstituted arylene group of 6 to 30 carbon atoms for forming a ring, or a substituted or unsubstituted heteroarylene group of 2 to 30 carbon atoms for forming a ring. However, L' is not a polyacenylene having three or more rings.

In Formula 4, $R_2$ may be a hydrogen atom, a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

In Formula 4, "p" may be an integer of 0 to 5. Meanwhile, if "p" is 2 or more, a plurality of L' groups may be the same or different.

In Formula 4, "a" may be an integer of 0 to 7. Meanwhile, if "a" is 2 or more, a plurality of $R_2$ groups may be the same or different.

In Formula 4, $Ar_1$, L, $R_1$, "m" and "n" are the same as defined in Formula 1.

In one or more embodiments, Formula 1 may be represented by the following Formula 5:

Formula 5

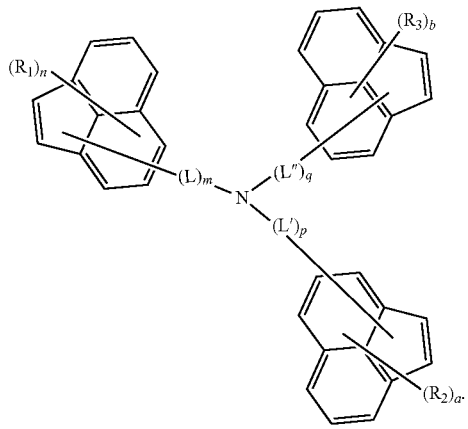

In Formula 5, L' and L" may each independently be a substituted or unsubstituted arylene group of 6 to 30 carbon atoms for forming a ring, or a substituted or unsubstituted heteroarylene group of 2 to 30 carbon atoms for forming a ring. L' and L" may not each independently be a polyacenylene having three or more rings.

In Formula 5, $R_2$ and $R_1$ may each independently be a hydrogen atom, a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

In Formula 5, "p" and "q" may each independently be an integer of 0 to 5. Meanwhile, if "p" is 2 or more, a plurality of L' groups may be the same or different, and if "q" is 2 or more, a plurality of L" groups may be the same or different.

In Formula 5, "a" and "b" may each independently be an integer of 0 to 7. Meanwhile, if "a" is 2 or more, a plurality of $R_2$ groups may be the same or different, and if "b" is 2 or more, a plurality of $R_3$ groups may be the same or different.

In Formula 5, L, $R_1$, "m" and "n" are the same as defined in Formula 1.

In one or more embodiments, Formula 1 may be represented by the following Formula 6:

Formula 6

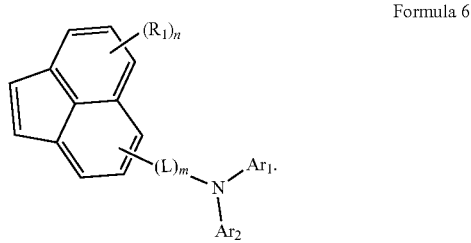

In Formula 6, $Ar_1$, $Ar_2$, L, $R_1$, and "m" are the same as defined in Formula 1, and "n" may be an integer of 0 to 3.

The monoamine compound represented by Formula 1 according to one or more embodiments of the inventive concept may be any one selected among the compounds represented in the following Compound Group 1, but one or more embodiments of the inventive concept are not limited thereto:

Compound Group 1

A1

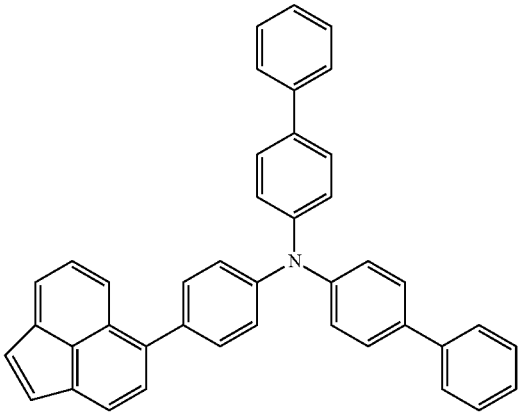

A2
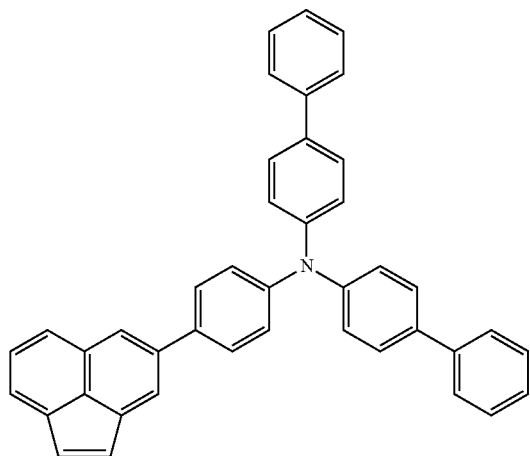
A5
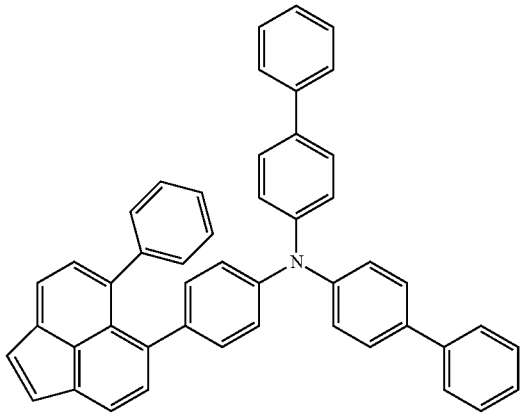
A3
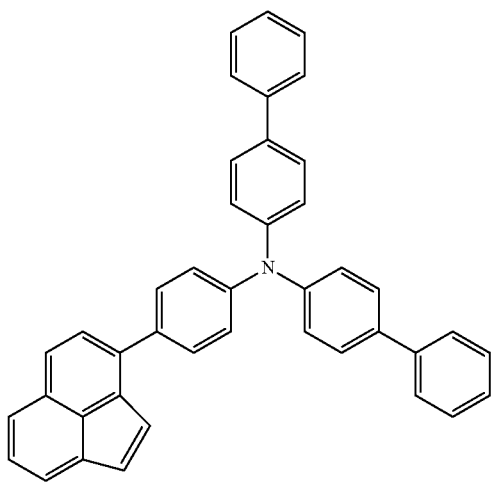
A6
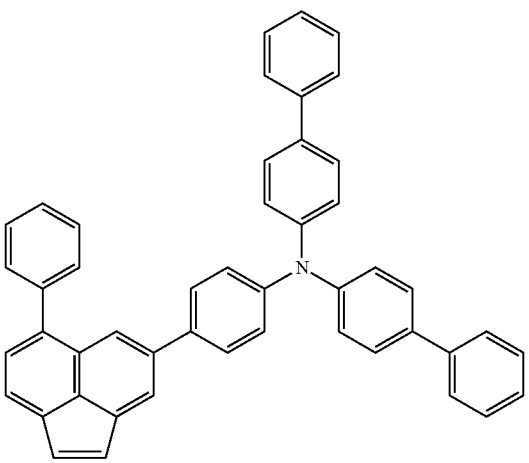
A4
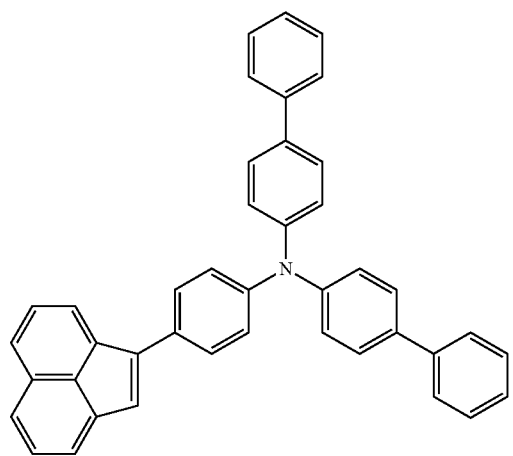
A7
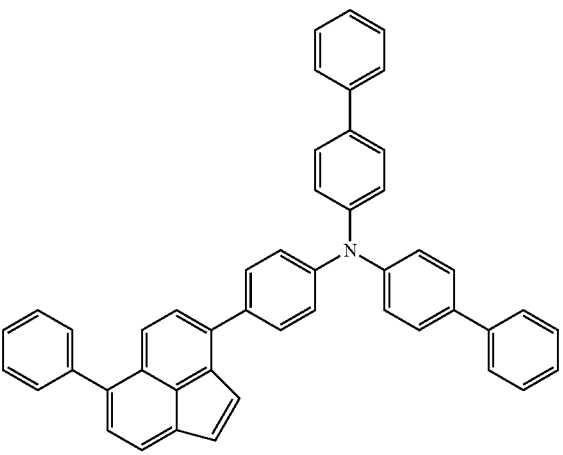

A8
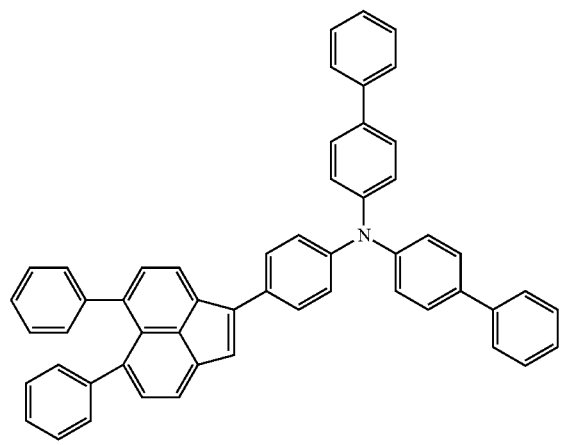
A9
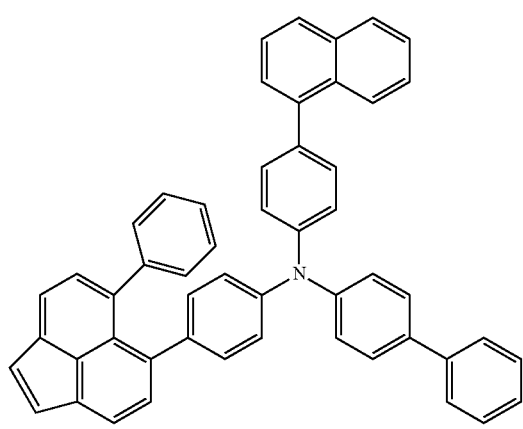
A10
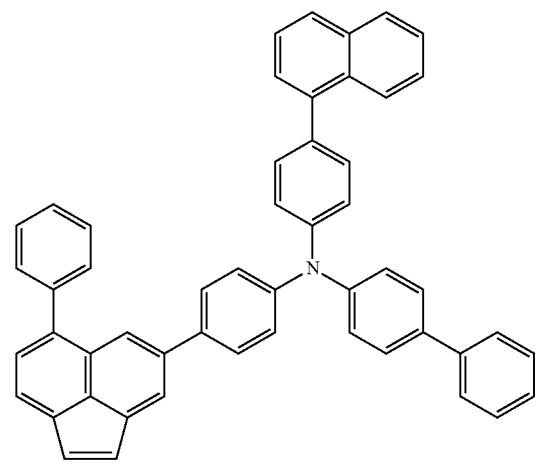
A11
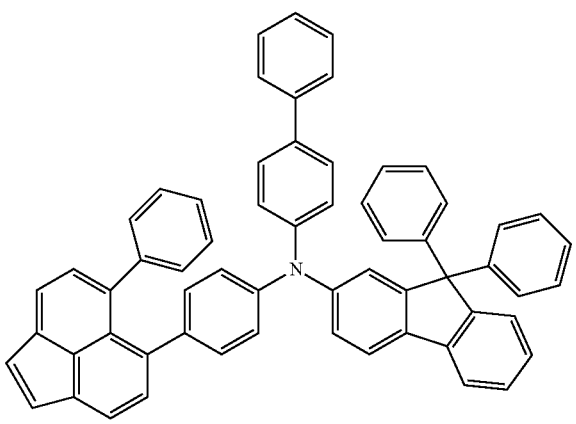
A12
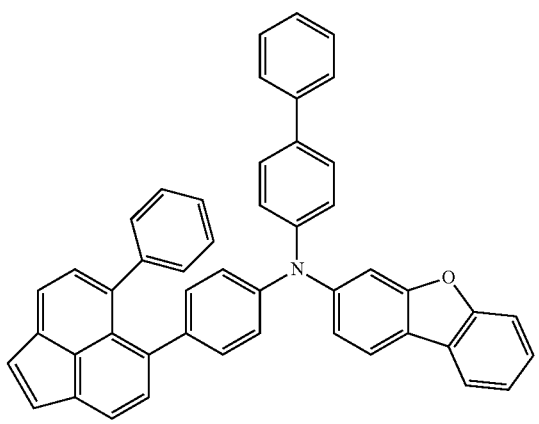
A13

A14
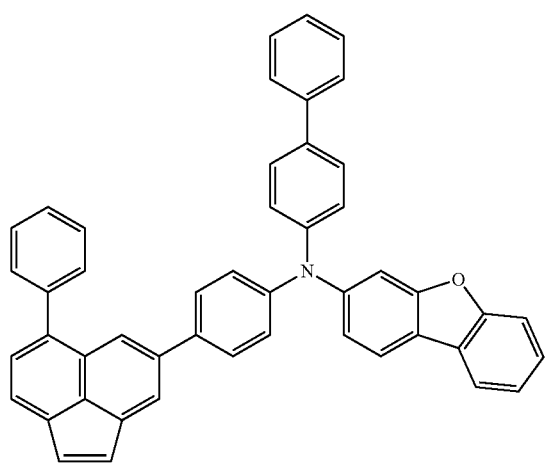
A15
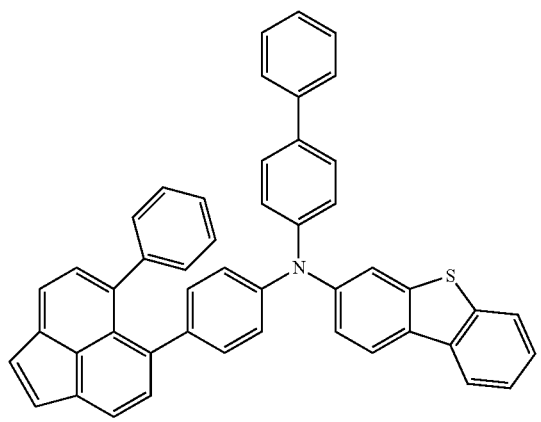
A16
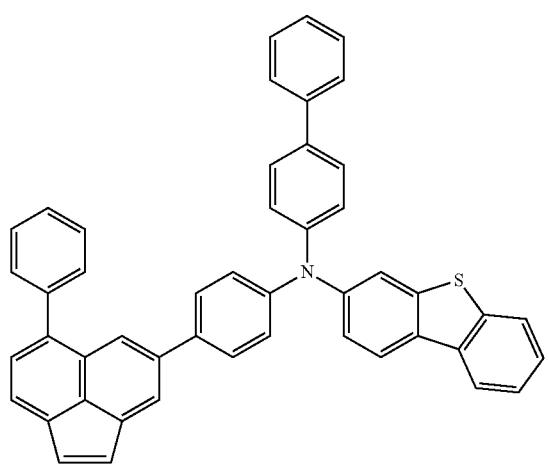
A17
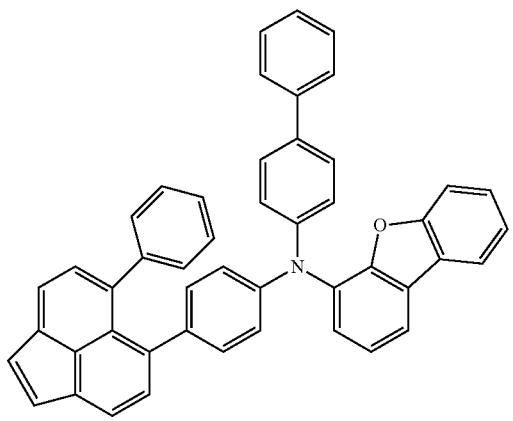
A18
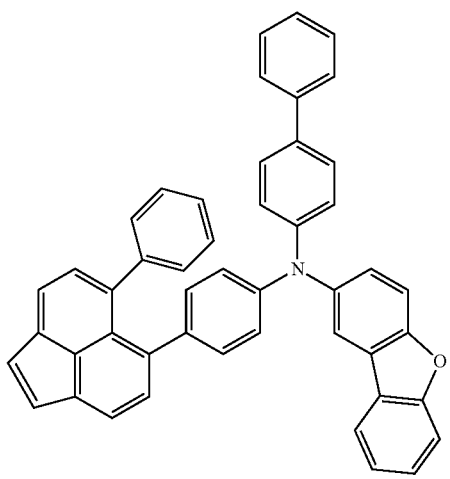
A19
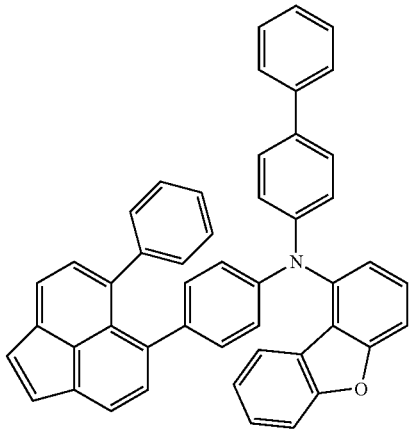

-continued
A20
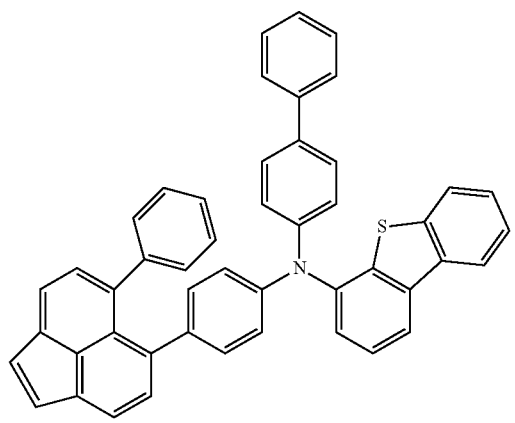
A21
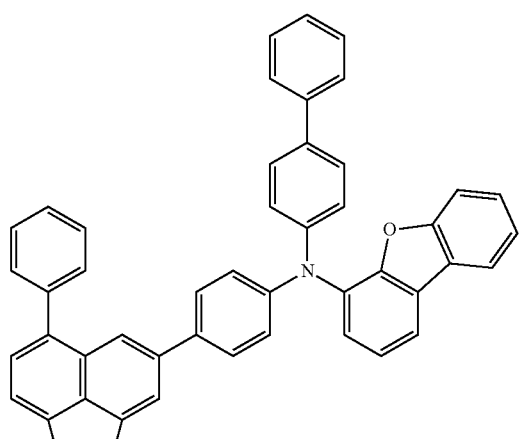
A22
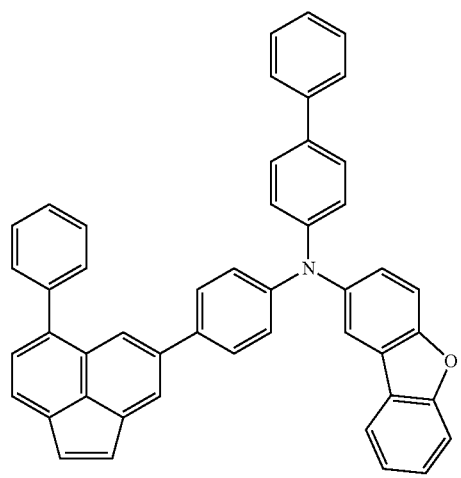
-continued
A23
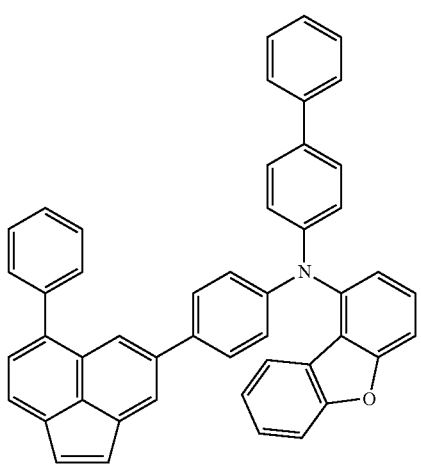
A24
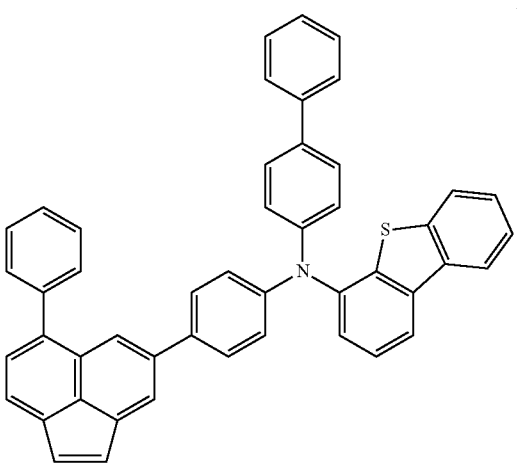
A25
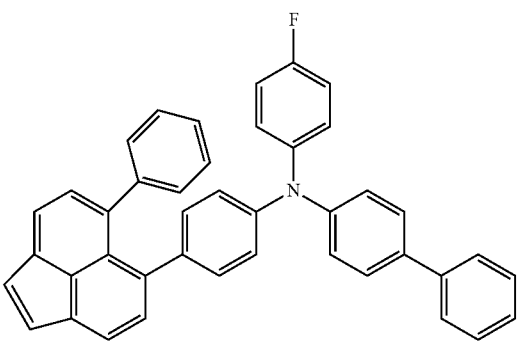

A26
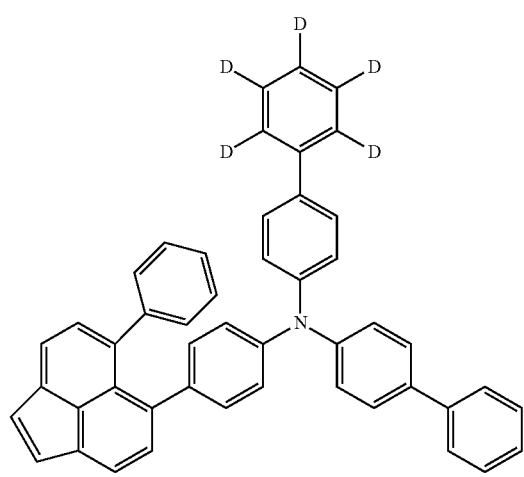
A27
A28
A29
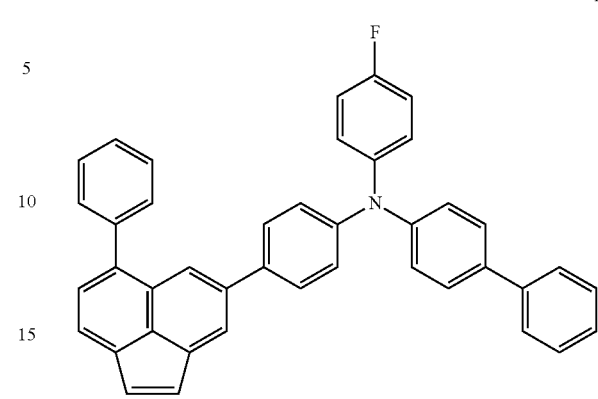
A30
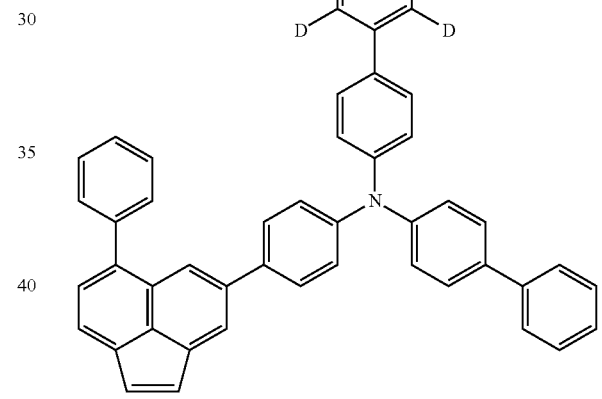
A31
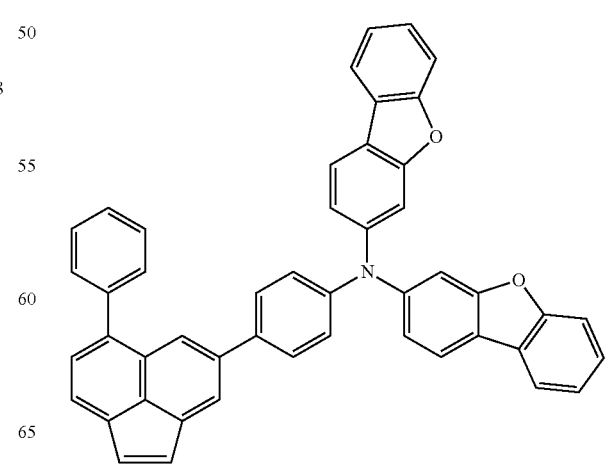

A32
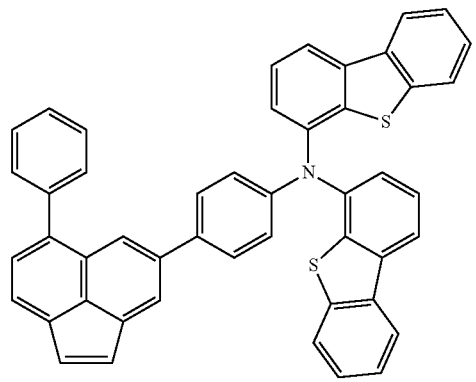
A35
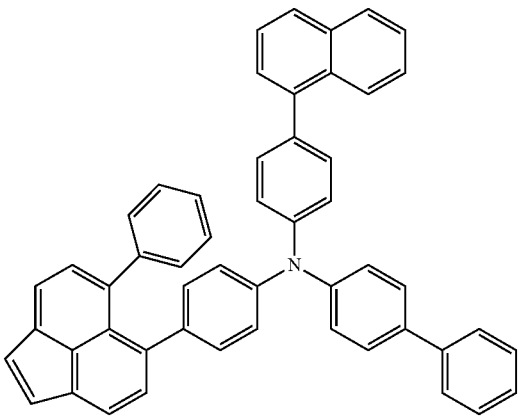
A33
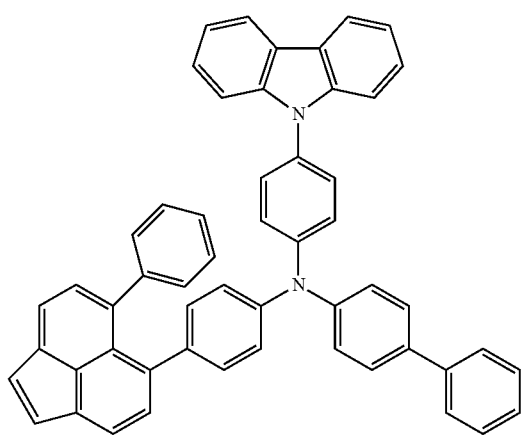
A36
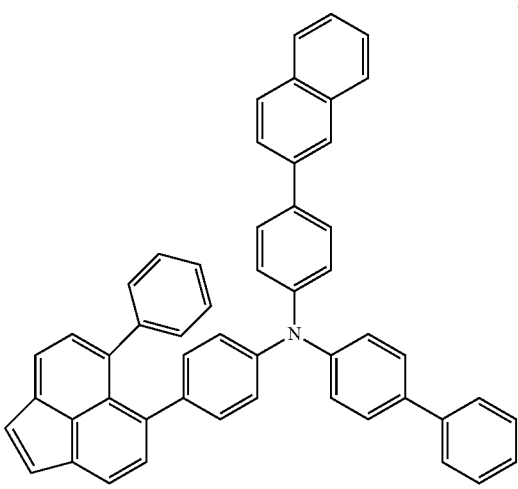
A34
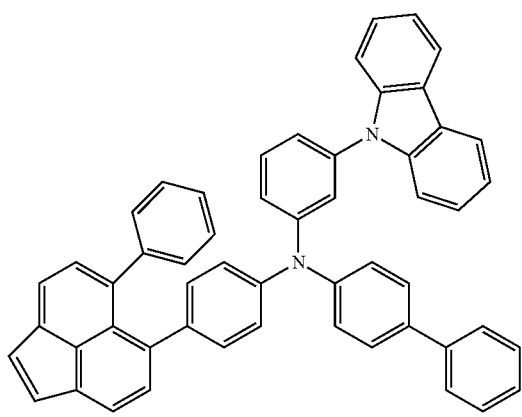
A37
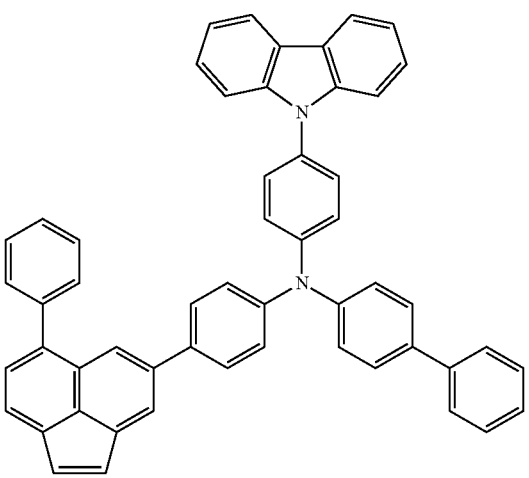

-continued
A38
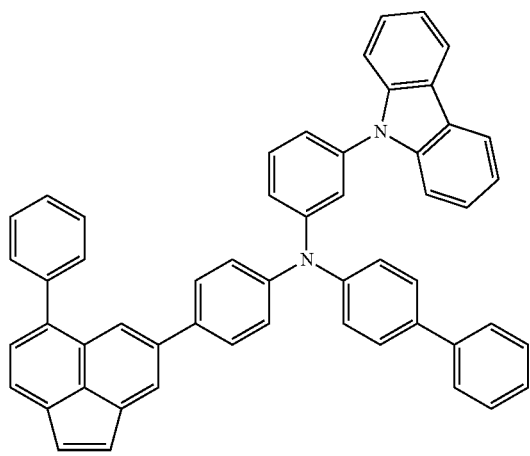
A39
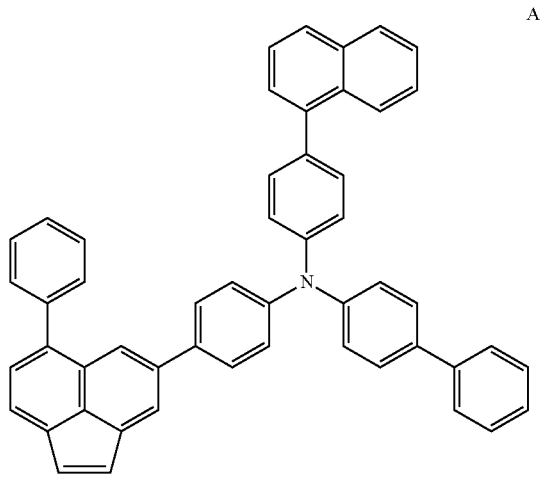
A40
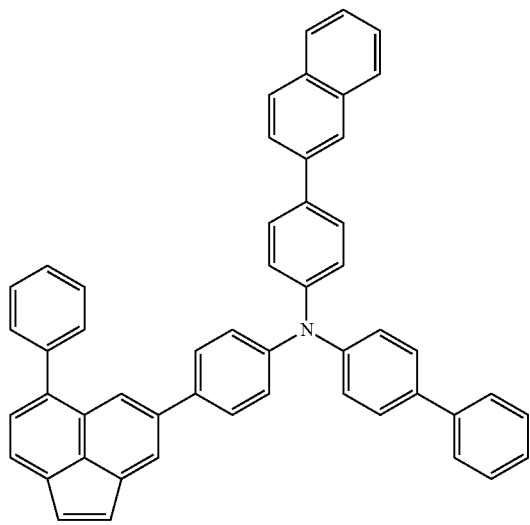
-continued
A41
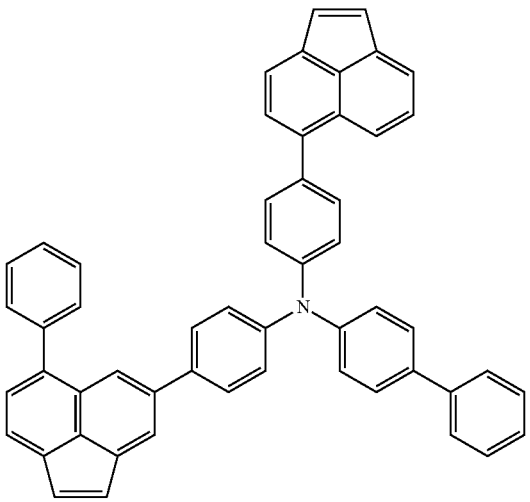
A42
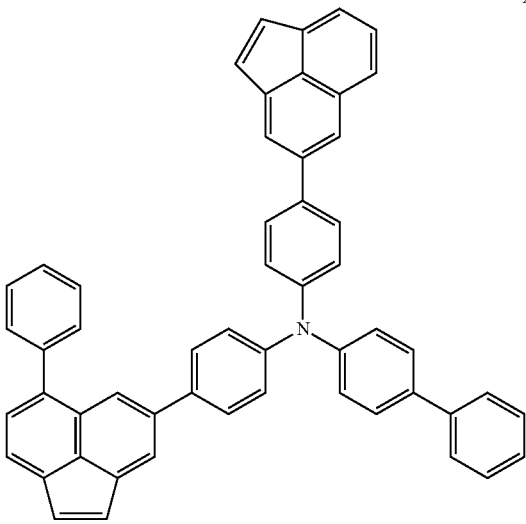
A43
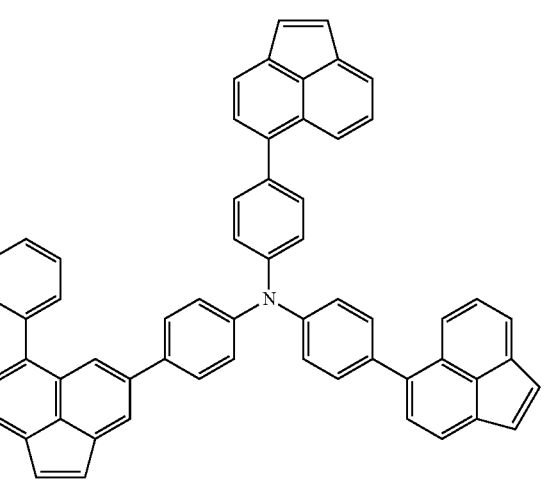

A44
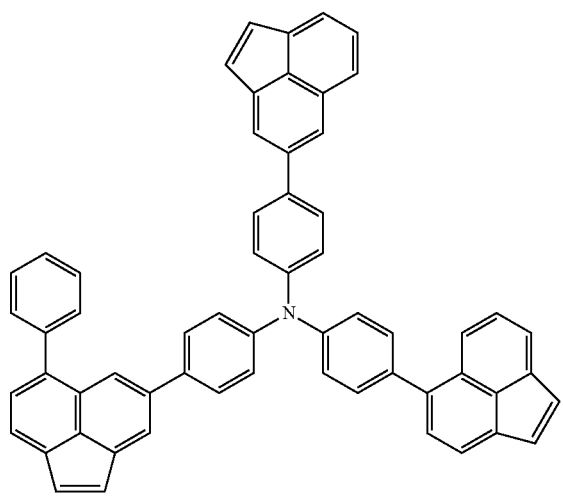
A47
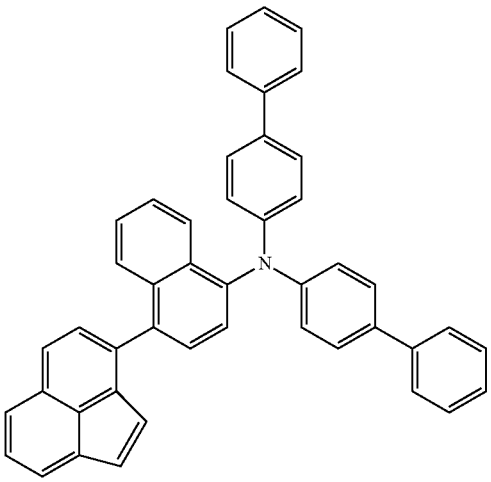
A45
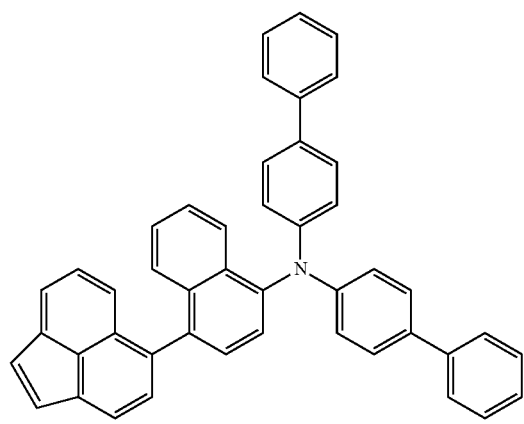
A48
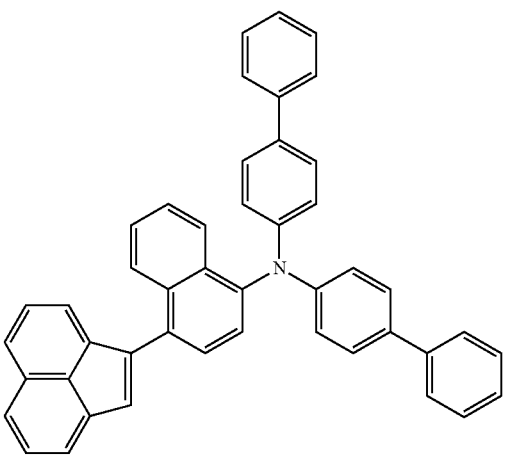
A46
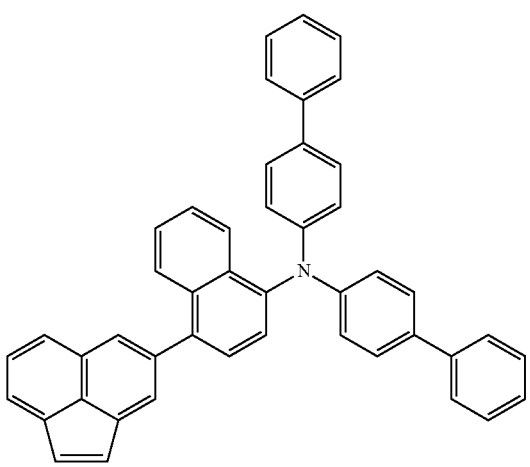
A49
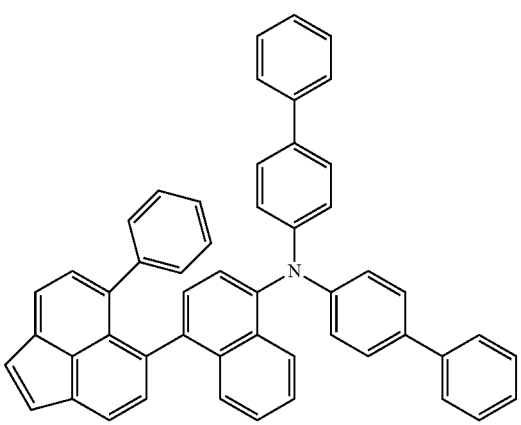

A50
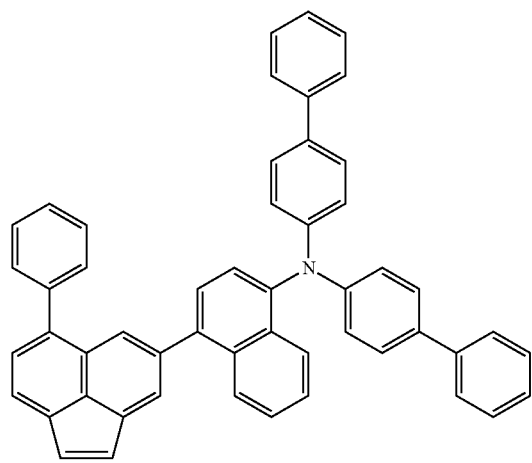
A51
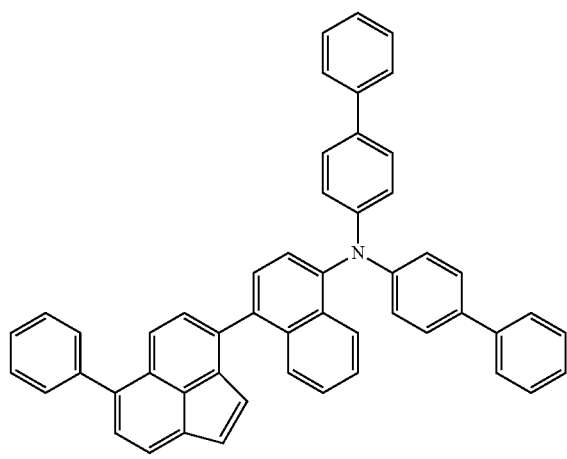
A52
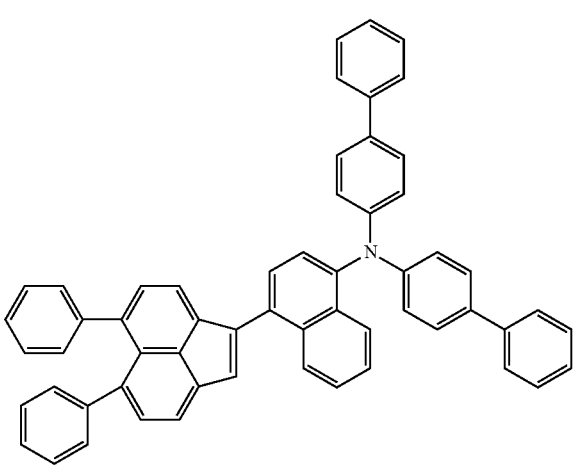
A53
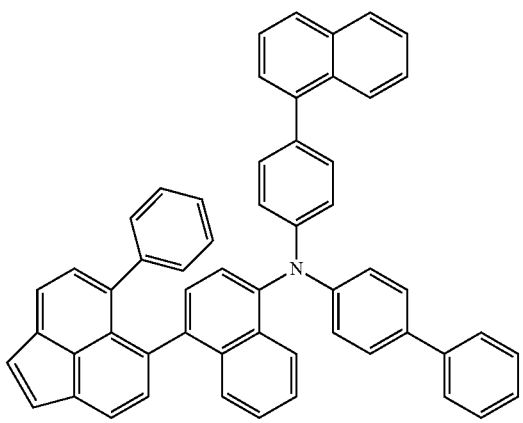
A54
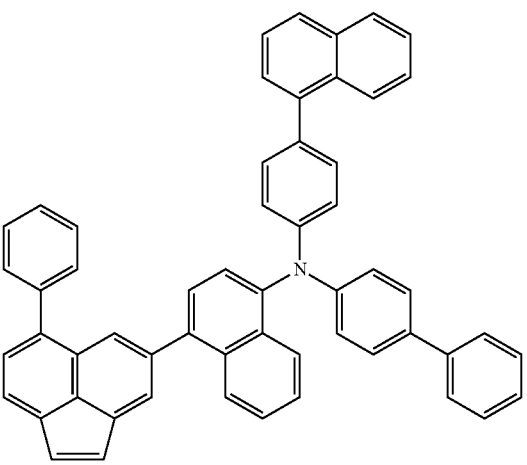
A55
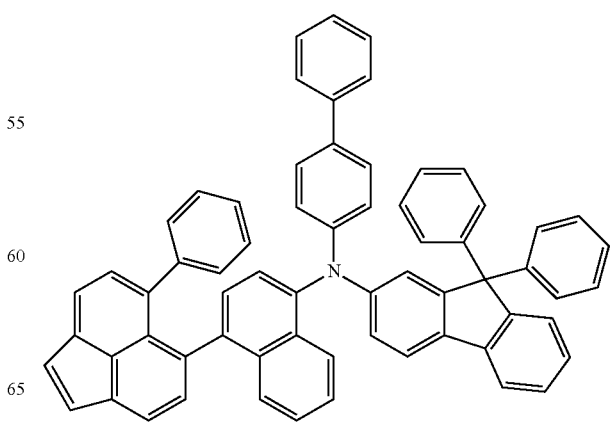

-continued
A56
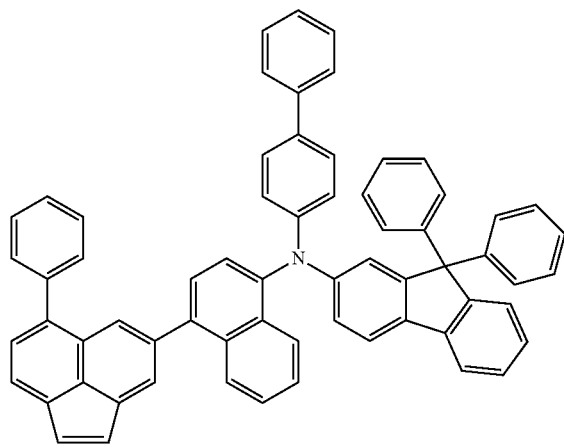
A57
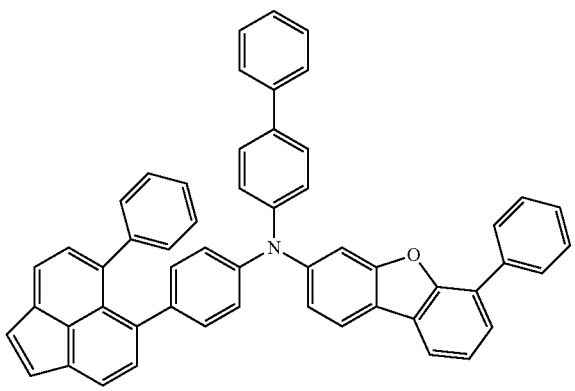
A58
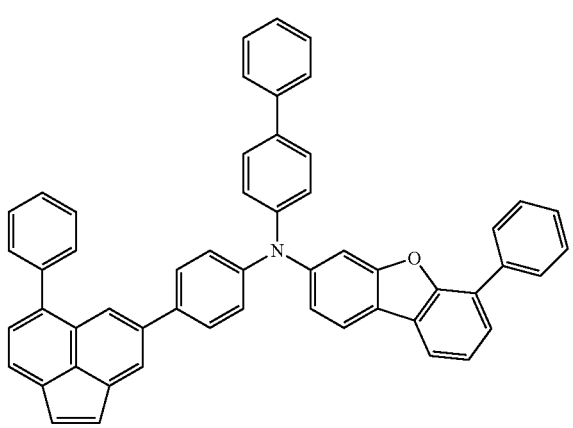
-continued
A59
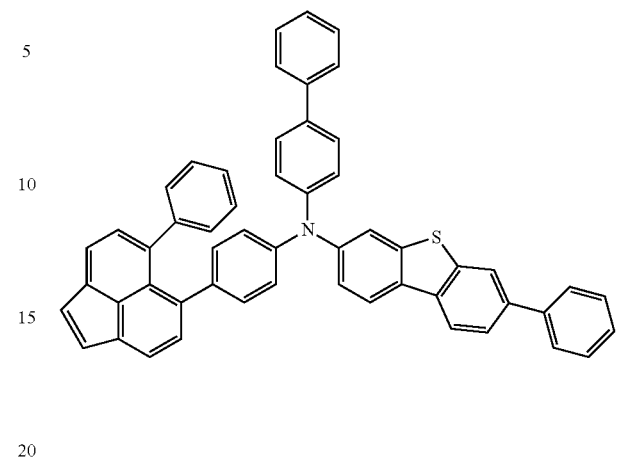
A60
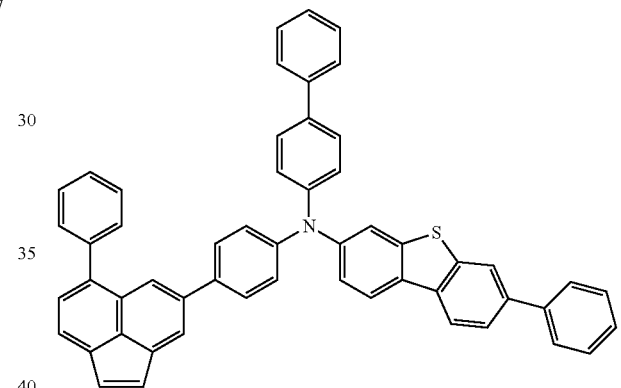
A61
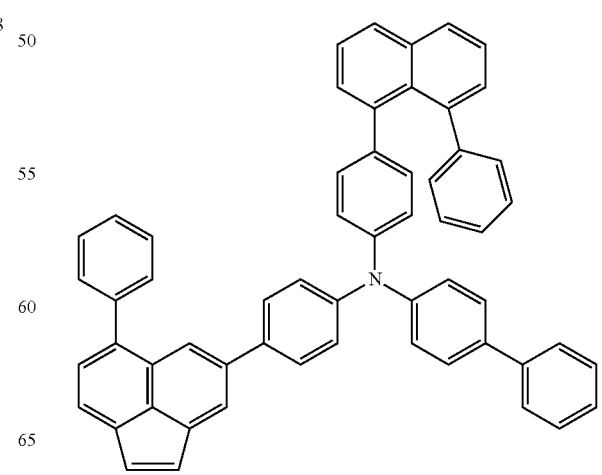

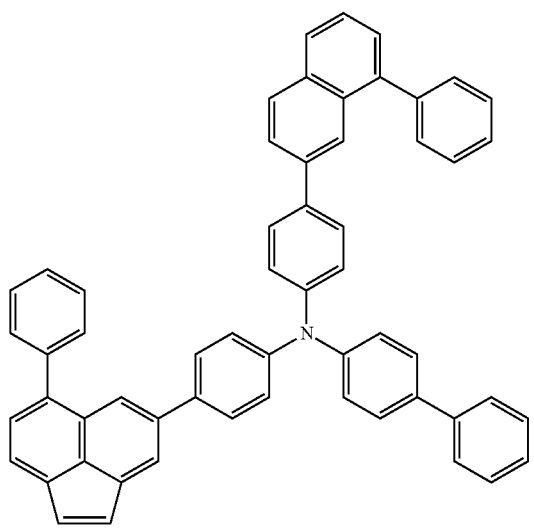
A62
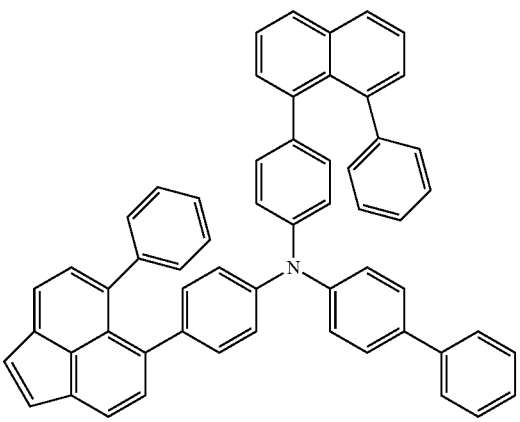
A65
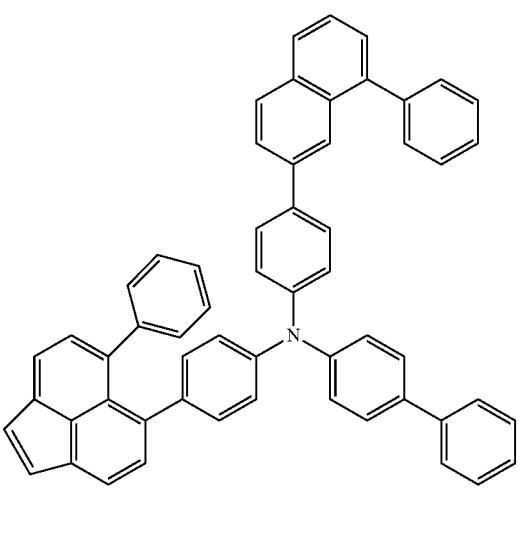
A66
A63
A64
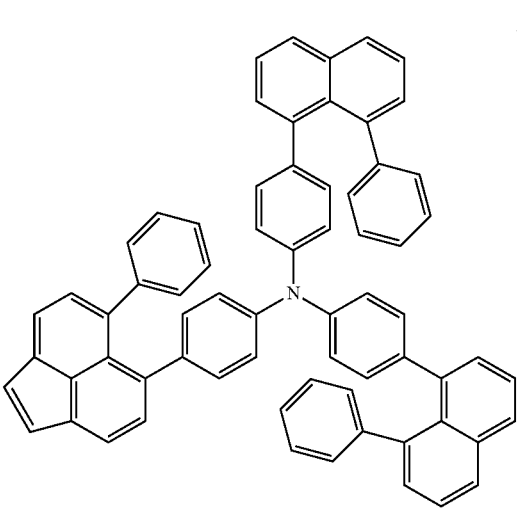
A67

A68
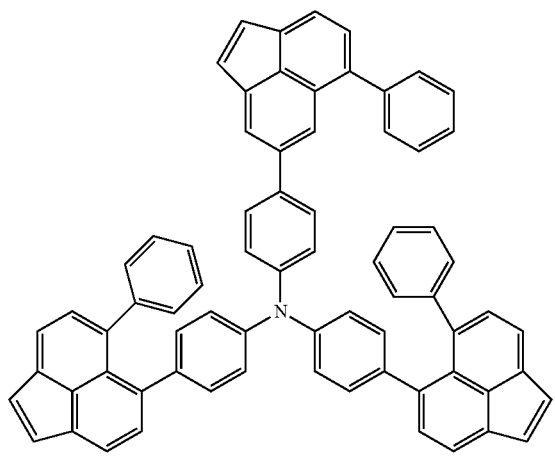
A71
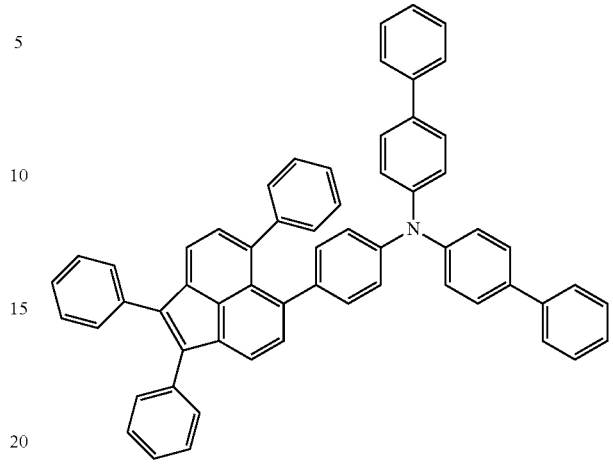
A69
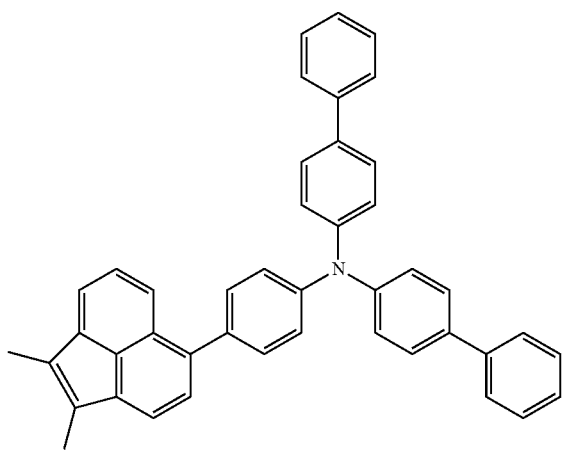
A72
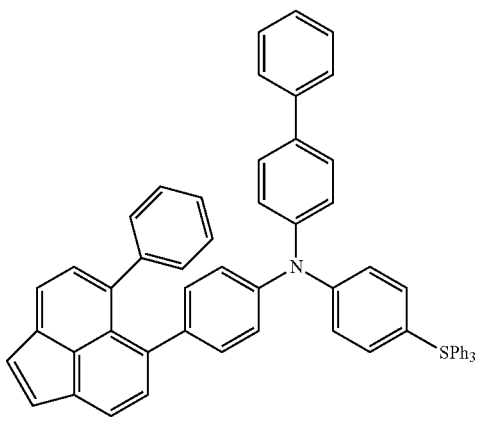
A70
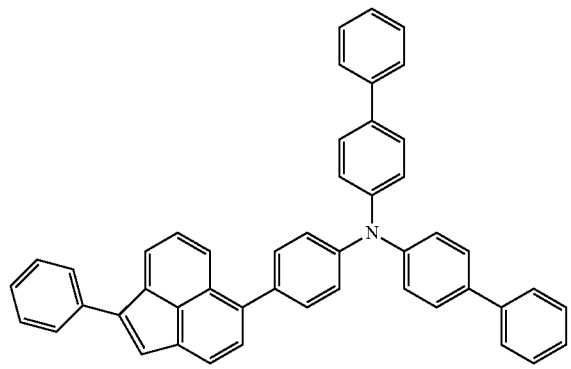
A73
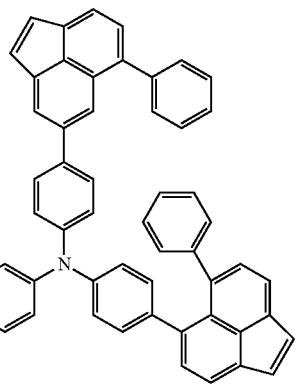

-continued

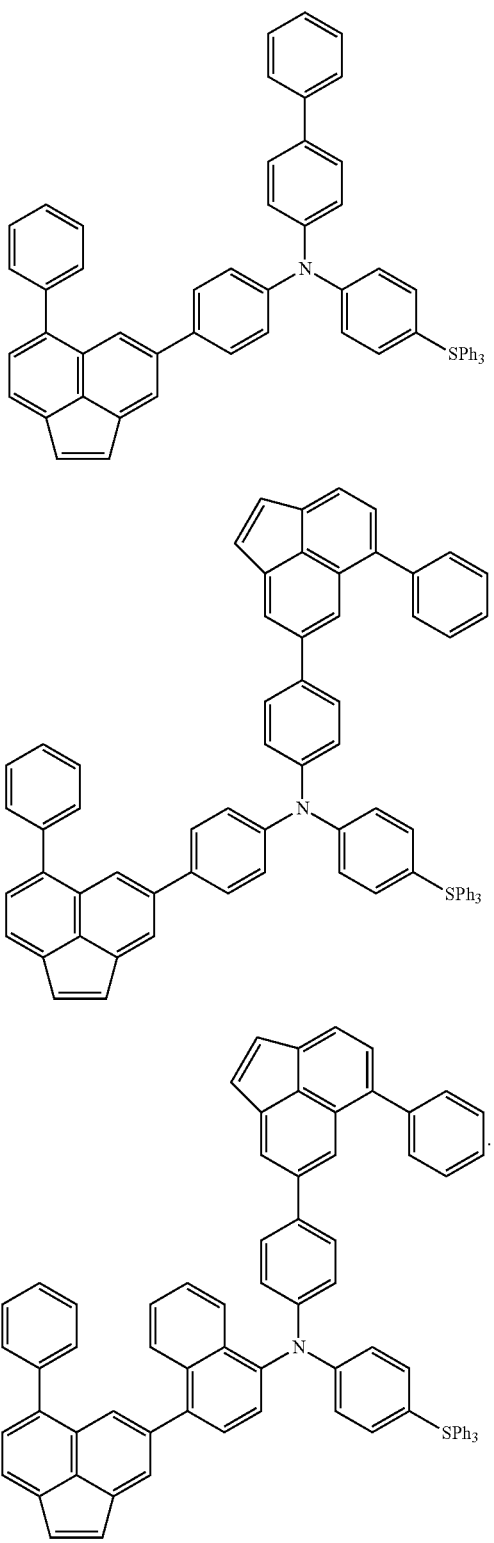

Referring to FIG. 1 to FIG. 3, the organic electroluminescence device 10 according to one or more embodiments of the inventive concept will be explained in more detail. In one or more embodiments, the hole transport region HTR includes the monoamine compound represented by Formula 1.

Hereinafter, explanation will be given mainly as to the differences between the monoamine compounds of the embodiments, and unexplained parts or elements will follow the descriptions thereof provided in connection with the monoamine compound of the previously described embodiments.

In the organic electroluminescence device 10 of one or more embodiments, the first electrode EL1 has conductivity. The first electrode EL1 may be formed using a metal alloy or a conductive compound. The first electrode EL1 may be an anode.

The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In one or more embodiments, the first electrode EL1 may have a multilayer structure including a reflective layer or a transflective layer, and a transmissive layer formed using ITO, IZO, ZnO, ITZO, etc. For example, the first electrode EL1 may include a plurality of layers of ITO/Ag/ITO.

The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one selected from a hole injection layer HIL, a hole transport layer HTL, a hole buffer layer, and an electron blocking layer EBL.

The hole transport region HTR includes the monoamine compound according to one or more embodiments of the inventive concept as described above.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL, or a hole transport layer HTL, and may have a structure of a single layer formed using a hole injection material and a hole transport material. In one or more embodiments, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using one or more suitable method such as a vacuum deposition method, a spin coating method, a cast method, a Langmuir-Blodgett (LB) method, an inkjet printing method, a laser printing method, and/or a laser induced thermal imaging (LITI) method.

As described above, the hole transport region HTR may have a multilayer structure having a plurality of layers, and any one layer among the plurality of layers may include the monoamine compound represented by Formula 1. For example, the hole transport region HTR may include a hole injection layer HIL disposed (positioned) on the first electrode EL1 and a hole transport layer HTL disposed on the hole injection layer HIL, and the hole transport layer HTL may include the monoamine compound represented by Formula 1. For example, the hole injection layer HIL may include the monoamine compound represented by Formula 1. However, one or more embodiments of the inventive concept are not limited thereto. In addition, the hole transport region HTR may further include an electron blocking layer EBL disposed on the hole transport layer HTL, and the hole transport layer HTL may include the monoamine compound represented by Formula 1.

The hole transport region HTR may include one or two or more monoamine compounds represented by Formula 1. For example, the hole transport region HTR may include at least one selected among the compounds represented in Compound Group 1.

In one or more embodiments, the hole transport region HTR may further include any of the following materials. For example, the hole injection layer HIL may include triphenylamine-containing polyetherketone (TPAPEK), 4-isopropyl-4'-methyldiphenyliodoniumtetrakis(pentafluorophenyl)borate (PPBI), N,N'-diphenyl-N,N-bis-[4-(di(m-tolyl)-amino)-phenyl]-biphenyl-4,4'-diamine (DNTPD), a phthalocyanine compound such as copper phthalocyanine, 4,4',4''-tris[(3-methyl phenyl) phenylamino]triphenylamine (m-MTDATA), N,N'-di(1-naphthyl)-N,N'-diphenylbenzidine (NPB), N,N'-bis(1-naphthyl)-N,N'-diphenyl-1,1'-biphenyl-4,4'-diamine (α-NPD), 4,4',4''-tris(N,N-diphenylamino)triphenylamine (TDATA), 4,4',4''-tris(N,N-2-naphthyl(phenyl)amino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or dipyrazino[2,3-f:2',3'-h]quinoxaline-2,3,6,7,10,11-hexacarbonitrile (HAT-CN). However, one or more embodiments of the inventive concept are not limited thereto.

The hole transport layer HTL may further include the monoamine compound represented by Formula 1 as described above. Other suitable materials may be included, but one or more embodiments of the inventive concept are not limited thereto. For example, the hole transport layer HTL may include carbazole derivatives (such as N-phenyl carbazole and/or polyvinyl carbazole), fluorene derivatives, N,N'-bis(3-methylphenyl)-N,N-diphenyl-[1,1-biphenyl]-4,4'-diamine (TPD), triphenylamine derivatives such as 4,4',4''-tris(N-carbazolyl)triphenylamine (TCTA), N,N'-di(naphtalene-1-yl)-N,N'-diphenyl-benzidine (NPD), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), etc.

In one or more embodiments, the hole transport region HTR may further include an electron blocking layer EBL, and the electron blocking layer EBL may be disposed between the hole transport layer HTL and the emission layer EML. The electron blocking layer EBL is a layer which plays the role of preventing or reducing electron injection from the electron transport region ETR to the hole transport region HTR.

For example, the electron blocking layer EBL may include carbazole derivatives such as N-phenyl carbazole and/or polyvinyl carbazole, fluorene derivatives, N,N'-bis(3-methylphenyl)-N,N-diphenyl-[1,1-biphenyl]-4,4'-diamine (TPD), triphenylamine derivatives such as 4,4',4''-tris(N-carbazolyl)triphenylamine (TCTA), N,N'-di(naphtalene-1-yl)-N,N'-diphenyl-benzidine (NPD), 4,4'-cyclohexylidene bis[N,N-bis(4-methylhenyl)benzenamine] (TAPC), 4,4'-bis[N,N'-(3-tolyl)amino]-3,3'-dimethylbiphenyl (HMTPD), mCP, etc. In one or more embodiments, the electron blocking layer EBL may include the monoamine compound according to one or more embodiments of the inventive concept.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy any of the above-described ranges, satisfactory (or suitable) hole transport properties may be achieved without substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may be selected from quinone derivatives, metal oxides, and cyano group-containing compounds, without limitation. However, one or more embodiments of the inventive concept are not limited thereto. Non-limiting examples of the p-dopant may include quinone derivatives (such as tetracyanoquinodimethane (TCNQ) and/or 2,3,5,6-tetrafluoro-7,7,8,8-tetracyanoquinodimethane (F4-TCNQ)), and metal oxides (such as tungsten oxide and/or molybdenum oxide).

As described above, the hole transport region HTR may further include at least one selected from a hole buffer layer and an electron blocking layer EBL, in addition to the hole injection layer HIL and/or the hole transport layer HTL. The hole buffer layer may compensate an optical resonance distance according to the wavelength of light emitted from an emission layer EML and may increase light emission efficiency. Any of the materials which may be included in the hole transport region HTR may be used as materials which may be included in a hole buffer layer.

The emission layer EML is provided on the hole transport region HTR. The thickness of the emission layer EML may be, for example, from about 100 Å to about 600 Å. The emission layer EML may have a single layer formed using a single material, a single layer formed using a plurality of different materials, or a multilayer structure having a plurality of layers formed using a plurality of different materials.

The emission layer EML may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The emission layer EML may emit one of red, green, blue, white, yellow or cyan light. The emission layer EML may include a fluorescence-emitting material or a phosphorescence-emitting material.

As the materials of the emission layer EML, any suitable light-emitting materials may be used, and one selected among fluoranthene derivatives, pyrene derivative, arylacetylene derivative, anthracene derivatives, fluorene derivatives, perylene derivatives, chrysene derivatives, etc. may be used, without specific limitation. In one or more embodiments, pyrene derivatives, perylene derivatives, and/or anthracene derivatives may be used. For example, as the host material of the emission layer EML, one or more anthracene derivatives represented by Formula 7 may be used:

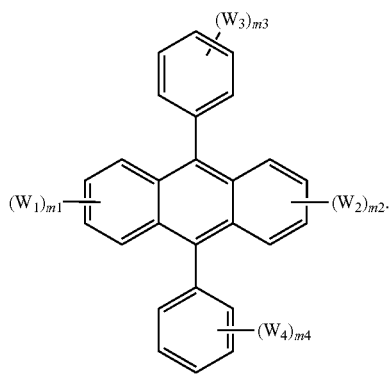

Formula 7

In Formula 7, $W_1$ to $W_4$ may each independently be a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and $W_1$ to $W_4$ may be combined with an adjacent group to form a ring, where m1 and m2 may each independently be an integer of 0 to 4, and m3 and m4 may each independently be an integer of 0 to 5.

If m1 is 1, $W_1$ may not be a hydrogen atom, if m2 is 1, $W_2$ may not be a hydrogen atom, if m3 is 1, $W_3$ may not be a hydrogen atom, and if m4 is 1, $W_4$ may not be a hydrogen atom.

If m1 is 2 or more, a plurality of $W_1$ groups may be the same or different. If m2 is 2 or more, a plurality of $W_2$ groups may be the same or different. If m3 is 2 or more, a plurality of $W_3$ groups may be the same or different. If m4 is 2 or more, a plurality of $W_4$ groups may be the same or different.

The compound represented by Formula 7 may include the compounds represented by the following structures, but the compound represented by Formula 7 is not limited thereto:

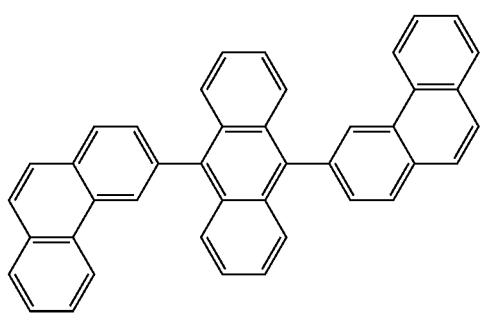

a-1

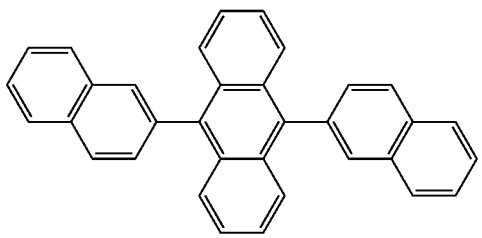

a-2

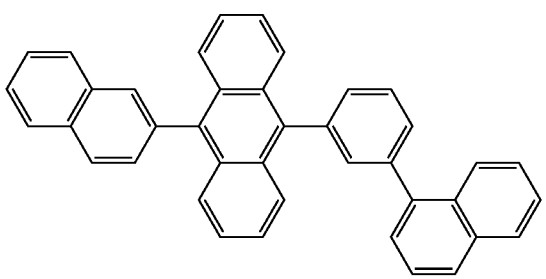

a-3

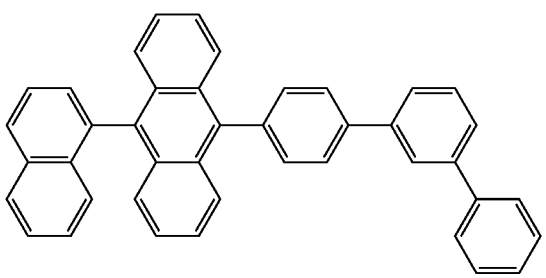

a-4

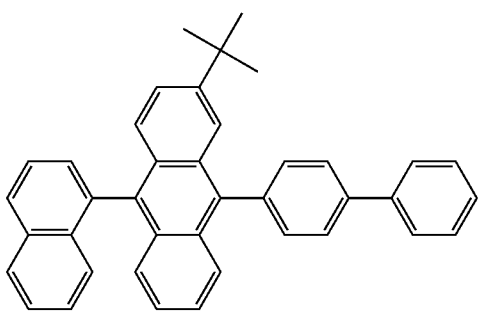

a-5

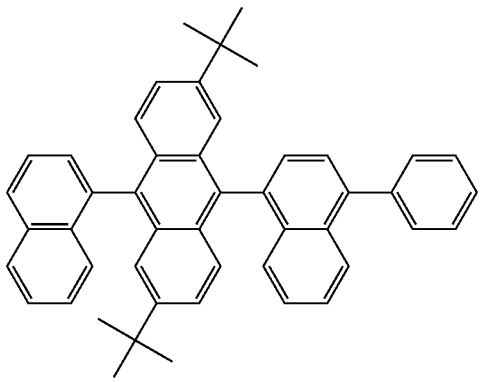

a-6 a-7

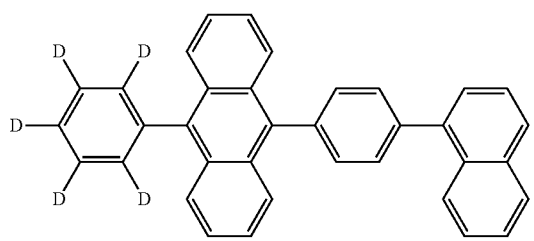

a-12

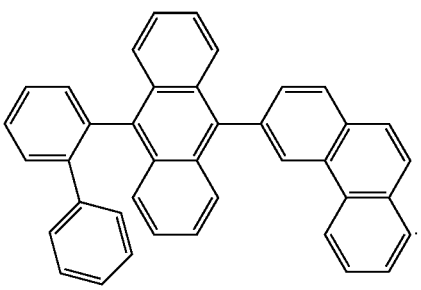

a-8

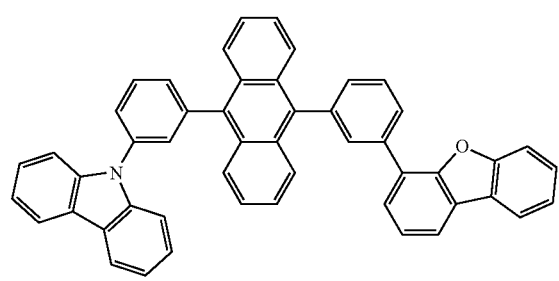

a-9

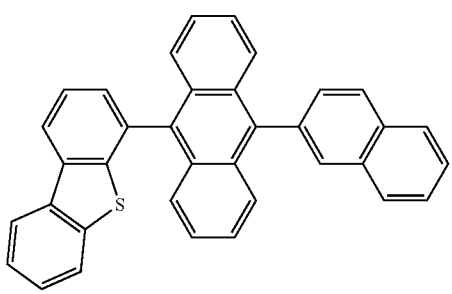

a-10

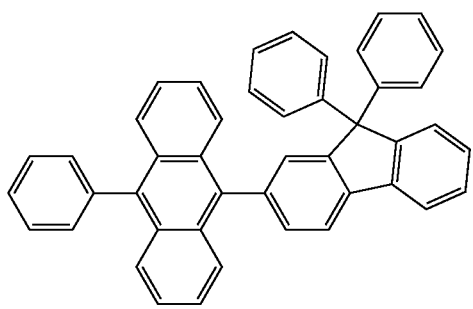

a-11

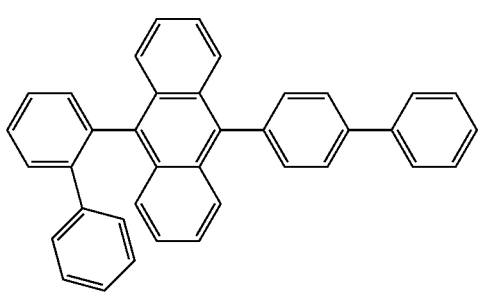

The emission layer EML may include a fluorescence material including, for example, any one selected from spiro-DPVBi, 2,2',7,7'-tetrakis(biphenyl-4-yl)-9,9'-spirobifluorene(spiro-sexiphenyl) (spiro-6P), distyryl-benzene (DSB), distyryl-arylene (DSA), a polyfluorene (PFO)-based polymer and a poly(p-phenylene vinylene) (PPV)-based polymer.

The emission layer EML may further include a dopant, and the dopant may be any suitable material. For example, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E) (diphenylamino)styryl)naphthalen-2-yl)vinyl) phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1'-dipyrene, 1,4-dipyrenylbenzene, 1,4-bis(N,N-diphenylamino)pyrene, and/or 1,6-bis(N,N-diphenylamino) pyrene), 1,3,5-tris(N-phenylbenzimidazole-2-yl)benzene (TPBi), etc., may be used as the dopant.

The emission layer EML may include, for example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis (triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), etc.

The electron transport region ETR is provided on the emission layer EML. The electron transport region ETR may include at least one selected from an electron blocking layer HBL, an electron transport layer ETL, and an electron injection layer EIL, but one or more embodiments of the inventive concept are not limited thereto.

The electron transport region ETR may have a single layer formed using a single material, a single layer formed using a plurality of different materials, or a multilayer structure including a plurality of layers formed using a plurality of different materials.

For example, the electron transport region ETR may have the structure of a single layer such as an electron injection layer EIL, or an electron transport layer ETL, and may have a structure of a single layer formed using an electron injection material and an electron transport material. In addition, the electron transport region ETR may have a single layer structure having a plurality of different materials, or a structure laminated from the emission layer EML of electron transport layer ETL/electron injection layer EIL, or hole blocking layer HBL/electron transport layer ETL/electron injection layer EIL, without limitation. The thickness of the electron transport region ETR may be, for example, from about 100 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazole-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1-biphenyl-4-olato)aluminum (BAlq), berylliumbis(benzoquinolin-10-olate)(Bebq2), 9,10-di(naphthalene-2-yl)anthracene (ADN), or a mixture thereof. However, one or more embodiments of the inventive concept are not limited thereto.

If the electron transport region ETR includes the electron transport layer ETL, the thickness of the electron transport layer ETL may be from about 100 Å to about 1,000 Å and may be, for example, from about 150 Å to about 500 Å. If the thickness of the electron transport layer ETL satisfies the above-described range, satisfactory (or suitable) electron transport properties may be obtained without substantial increase of a driving voltage.

If the electron transport region ETR includes the electron injection layer EIL, the electron transport region ETR may include, for example, LiF, 8-hydroxyl-lithium quinolate (LiQ), $Li_2O$, BaO, NaCl, CsF, a metal in lanthanoides (such as Yb), and/or a metal halide (such as RbCl, RbI and/or KI). However, one or more embodiments of the inventive concept are not limited thereto. The electron injection layer EIL also may be formed using a mixture material of an electron transport material and an insulating organo metal salt. The organo metal salt may be a material having an energy band gap of about 4 eV or more. In one or more embodiments, the organo metal salt may include, for example, metal acetates, metal benzoates, metal acetoacetates, metal acetylacetonates, and/or metal stearates.

If the electron transport region ETR includes the electron injection layer EIL, the thickness of the electron injection layer EIL may be from about 1 Å to about 100 Å, and from about 3 Å to about 90 Å. If the thickness of the electron injection layer EIL satisfies the above described range, satisfactory (or suitable) electron injection properties may be obtained without inducing substantial increase of a driving voltage.

The electron transport region ETR may include a hole blocking layer HBL as described above. The hole blocking layer HBL may include, for example, at least one selected from 2,9-dimethyl-4,7-diphenyl-1,10-phenanthroline (BCP), and 4,7-diphenyl-1,10-phenanthroline (Bphen). However, one or more embodiments of the inventive concept are not limited thereto.

The second electrode EL2 is provided on the electron transport region ETR. The second electrode EL2 has conductivity. The second electrode EL2 may be formed using a metal alloy and/or a conductive compound. The second electrode EL2 may be a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In one or more embodiments, the second electrode EL2 may have a multilayered structure including a reflective layer or a transflective layer formed using any of the above-described materials, and a transparent conductive layer formed using ITO, IZO, ZnO, ITZO, etc.

The second electrode EL2 may be connected with an auxiliary electrode. If the second electrode EL2 is connected with the auxiliary electrode, the resistance of the second electrode EL2 may be decreased.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to produce excitons, and the excitons may emit light via transition from an excited state to a ground state.

If the organic electroluminescence device 10 is a top emission device, the first electrode EL1 may be a reflective electrode and the second electrode EL2 may be a transmissive electrode or a transflective electrode. If the organic electroluminescence device 10 is a bottom emission device, the first electrode EL1 may be a transmissive electrode or a transflective electrode and the second electrode EL2 may be a reflective electrode.

The organic electroluminescence device 10 according to one or more embodiments of the inventive concept is characterized in including the monoamine compound represented by Formula 1, and accordingly, the increase of efficiency and life may be achieved. In addition, the effect of decreasing a driving voltage may be achieved.

Hereinafter, the inventive concept will be explained in more detail by referring to example embodiments and comparative embodiments. The embodiments are only illustrations for assisting the understanding of the inventive concept, and the scope of the inventive concept is not limited thereto.

SYNTHETIC EXAMPLES

The monoamine compound according to one or more embodiments of the inventive concept may be synthesized, for example, as follows. However, the synthetic method of the monoamine compound according to one or more embodiments of the inventive concept is not limited thereto.

1. Synthesis of Compound A1

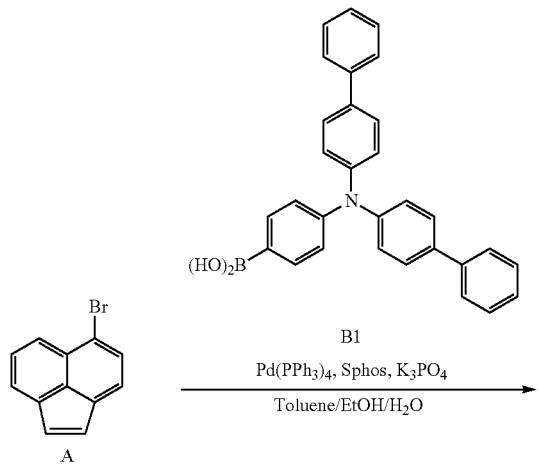

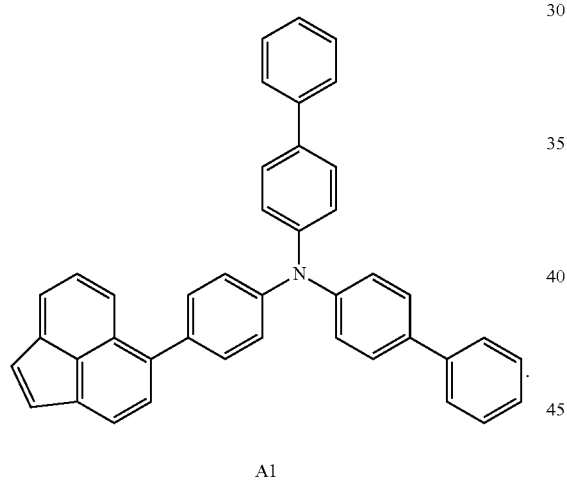

A1

To Reactant A (4.6 g, 20 mmol), compound B1 (9.1 g, 20 mmol), and K₃PO₄ (8.5 g, 40 mmol), toluene/EtOH/H₂O (v/v/v=4/2/1, 250 mL) was added and deaerated. Under an Ar atmosphere, 2-dicyclohexylphosphino-2',6'-dimethoxybiphenyl (Sphos) (1.6 g, 4.0 mmol) and tetrakis(triphenylphosphine)palladium (Pd(PPh₃)₄) (1.6 g, 1.4 mmol) were added thereto, and heated and stirred at about 85° C. for about 6 hours. The obtained reaction solution was left to cool to room temperature, extracted with toluene, washed with H₂O and brine, and dried with anhydrous Na₂SO₄. The solution thus obtained was concentrated and separated by column chromatography to obtain Compound A1 (8.8 g, 16 mmol, 81%). Fast Atom Bombardment-Mass Spectrometry (FAB-MS) was measured and mass number, m/z=547.2 was observed by the molecular ion peak, and Compound A1 was confirmed.

2. Synthesis of Compound A5

Synthesis of Intermediate C2

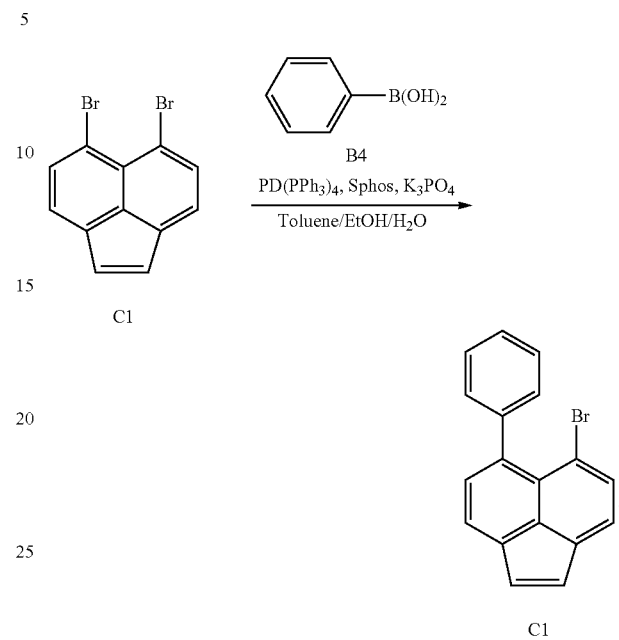

To Reactant C1 (12.4 g, 40 mmol), compound B4 (2.4 g, 20 mmol), and K₃PO₄ (4.3 g, 20 mmol), toluene/EtOH/H₂O (v/v/v=4/2/1, 140 mL) was added and deaerated. Under an Ar atmosphere, Sphos (1.6 g, 4.0 mmol) and Pd(PPh₃)₄ (1.6 g, 1.4 mmol) were added thereto, and heated and stirred at about 85° C. for about 6 hours. The obtained reaction solution was left to cool to room temperature, extracted with toluene, washed with H₂O and brine, and dried with anhydrous Na₂SO₄. The solution thus obtained was concentrated and separated by column chromatography to obtain Intermediate C2 (3.1 g, 10 mmol, 49%). FAB-MS was measured and mass number, m/z=306.0 was observed by the molecular ion peak, and Intermediate C2 was confirmed.

Synthesis of Compound A5

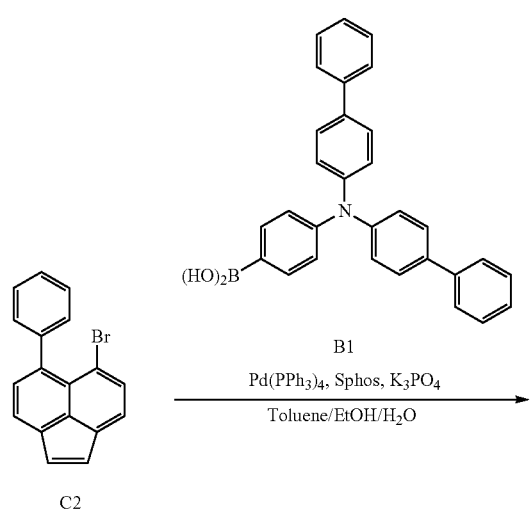

-continued

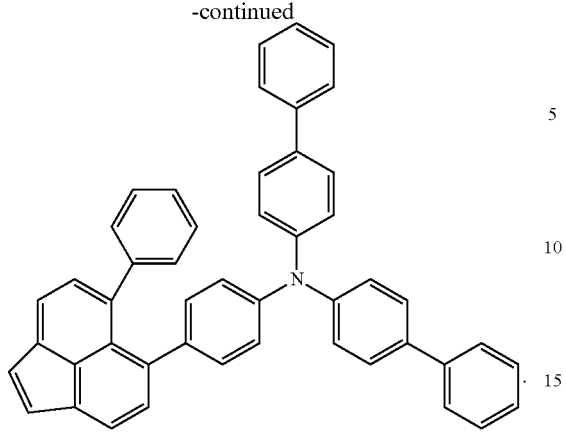

A5

To Intermediate C2 (6.1 g, 20 mmol), compound B1 (9.1 g, 20 mmol), and K₃PO₄ (8.5 g, 40 mmol), toluene/EtOH/H₂O (v/v/v=4/2/1, 250 mL) was added and deaerated. Under an Ar atmosphere, Sphos (1.6 g, 4.0 mmol) and Pd(PPh₃)₄ (1.6 g, 1.4 mmol) were added thereto, and heated and stirred at about 85° C. for about 6 hours. The obtained reaction solution was left to cool to room temperature, extracted with toluene, washed with H₂O and brine, and dried with anhydrous Na₂SO₄. The solution thus obtained was concentrated and separated by column chromatography to obtain Compound A5 (8.0 g, 13 mmol, 64%). FAB-MS was measured and mass number, m/z=623.26 was observed by the molecular ion peak, and Compound A5 was confirmed.

3. Synthesis of Compound A12

Synthesis of Intermediate C3

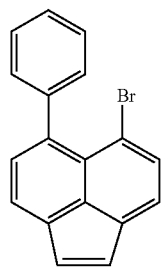

C2

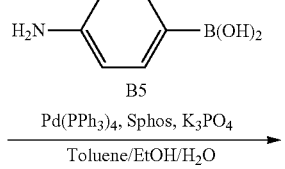

B5

Pd(PPh₃)₄, Sphos, K₃PO₄
Toluene/EtOH/H₂O

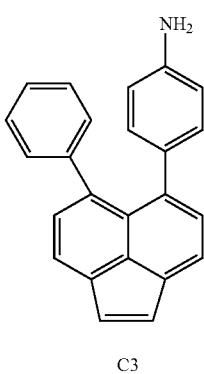

C3

To Intermediate C2 (6.1 g, 20 mmol), compound B5 (2.7 g, 20 mmol), and K₃PO₄ (8.5 g, 40 mmol), toluene/EtOH/H₂O (v/v/v=4/2/1, 140 mL) was added and deaerated. Under an Ar atmosphere, Sphos (1.6 g, 4.0 mmol) and Pd(PPh₃)₄ (1.6 g, 1.4 mmol) were added thereto, and heated and stirred at about 85° C. for about 6 hours. The obtained reaction solution was left to cool to room temperature, extracted with toluene, washed with H₂O and brine, and dried with anhydrous Na₂SO₄. The solution thus obtained was concentrated and separated by column chromatography to obtain Intermediate C3 (3.2 g, 10 mmol, 51%). FAB-MS was measured and mass number, m/z=319.14 was observed by the molecular ion peak, and Intermediate C3 was confirmed.

Synthesis of Intermediate C4

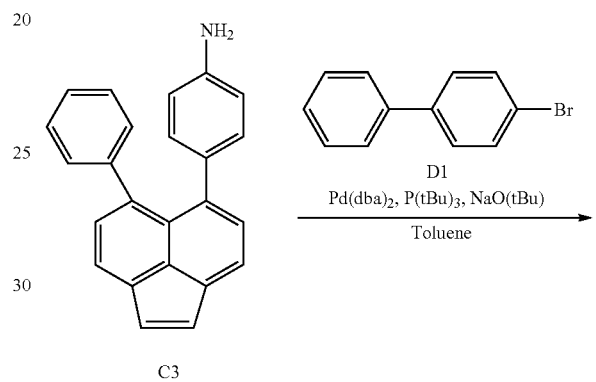

D1

Pd(dba)₂, P(tBu)₃, NaO(tBu)
Toluene

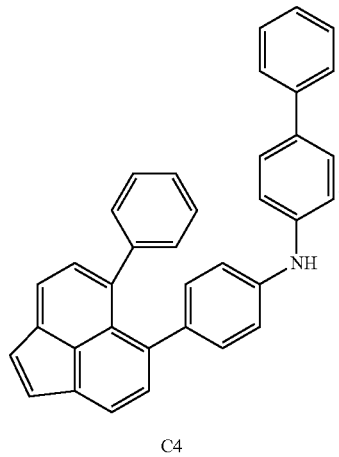

C4

To Intermediate C3 (3.2 g, 10 mmol), compound D1 (2.3 g, 10 mmol), and Na(OtBu) (0.96 g, 10 mmol), toluene (150 mL) was added and deaerated. Under an Ar atmosphere, tri-tert-butylphosphine (P(tBu)₃) (1.4 mL, 1.5 M in toluene) and Pd(dba)₂ (0.29 g, 0.51 mmol) were added thereto, and heated and stirred at about 85° C. for about 6 hours. The obtained reaction solution was left to cool to room temperature, extracted with toluene, washed with H₂O and brine, and dried with anhydrous Na₂SO₄. The solution thus obtained was concentrated and separated by column chromatography to obtain Intermediate C4 (3.8 g, 8.1 mmol, 81%). FAB-MS was measured and mass number, m/z=471.20 was observed by the molecular ion peak, and Intermediate C4 was confirmed.

Synthesis of Compound A12

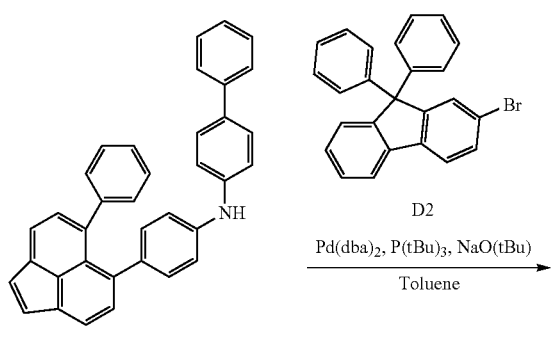

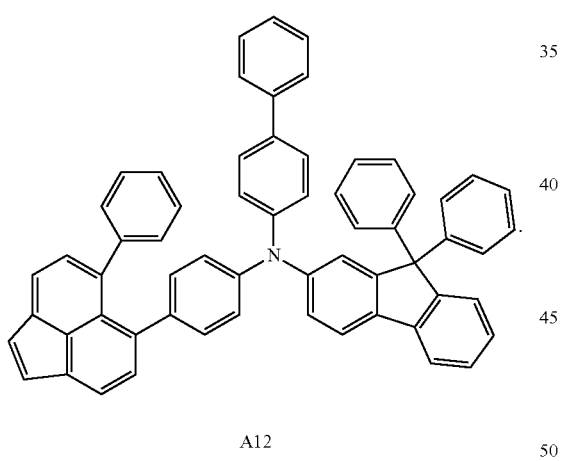

To Intermediate C4 (4.8 g, 10 mmol), compound D2 (4.0 g, 10 mmol), and Na(OtBu) (0.96 g, 10 mmol), toluene (150 mL) was added and deaerated. Under an Ar atmosphere, tri-tert-butylphosphine (P(tBu)$_3$) (1.4 mL, 1.5 M in toluene) and Pd(dba)$_2$ (0.29 g, 0.51 mmol) were added thereto, and heated and stirred at about 85° C. for about 6 hours. The obtained reaction solution was left to cool to room temperature, extracted with toluene, washed with H$_2$O and brine, and dried with anhydrous Na$_2$SO$_4$. The solution thus obtained was concentrated and separated by column chromatography to obtain Compound A12 (5.6 g, 7.1 mmol, 71%). FAB-MS was measured and mass number, m/z=787.32 was observed by the molecular ion peak, and Compound A12 was confirmed.

4. Synthesis of Compound A17

Synthesis of Compound A17

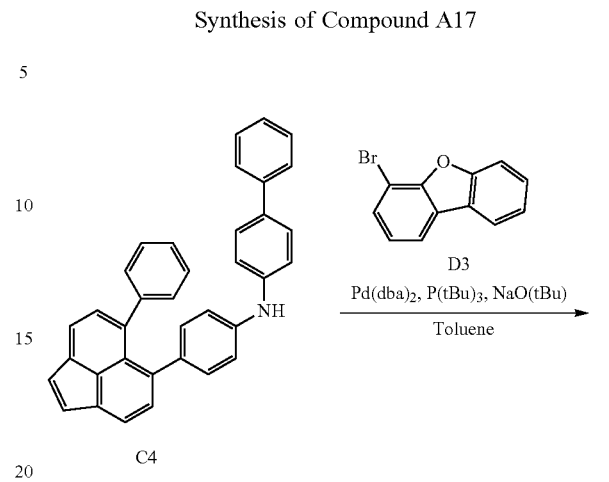

To Intermediate C4 (4.8 g, 10 mmol), compound D3 (2.5 g, 10 mmol), and Na(OtBu) (0.96 g, 10 mmol), toluene (150 mL) was added and deaerated. Under an Ar atmosphere, tri-tert-butylphosphine (1.4 mL, 1.5 M in toluene) and Pd(dba)$_2$ (0.29 g, 0.51 mmol) were added thereto, and heated and stirred at about 85° C. for about 6 hours. The obtained reaction solution was left to cool to room temperature, extracted with toluene, washed with H$_2$O and brine, and dried with anhydrous Na$_2$SO$_4$. The solution thus obtained was concentrated and separated by column chromatography to obtain Compound A17 (4.1 g, 6.4 mmol, 64%). FAB-MS was measured and mass number, m/z=637.24 was observed by the molecular ion peak, and Compound A17 was confirmed.

5. Synthesis of Compound A33

Synthesis of Compound A33

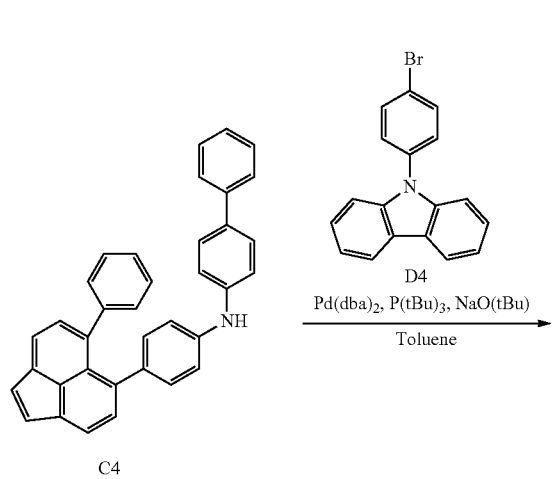

To Intermediate C4 (4.8 g, 10 mmol), compound D4 (3.2 g, 10 mmol), and Na(OtBu) (0.96 g, 10 mmol), toluene (150 mL) was added and deaerated. Under an Ar atmosphere, tri-tert-butylphosphine (1.4 mL, 1.5 M in toluene) and Pd(dba)$_2$ (0.29 g, 0.51 mmol) were added thereto, and heated and stirred at about 85° C. for about 6 hours. The obtained reaction solution was left to cool to room temperature, extracted with toluene, washed with H$_2$O and brine, and dried with anhydrous Na$_2$SO$_4$. The solution thus obtained was concentrated and separated by column chromatography to obtain Compound A33 (3.5 g, 4.9 mmol, 49%). FAB-MS was measured and mass number, m/z=712.29 was observed by the molecular ion peak, and Compound A33 was confirmed.

6. Synthesis of Compound A73

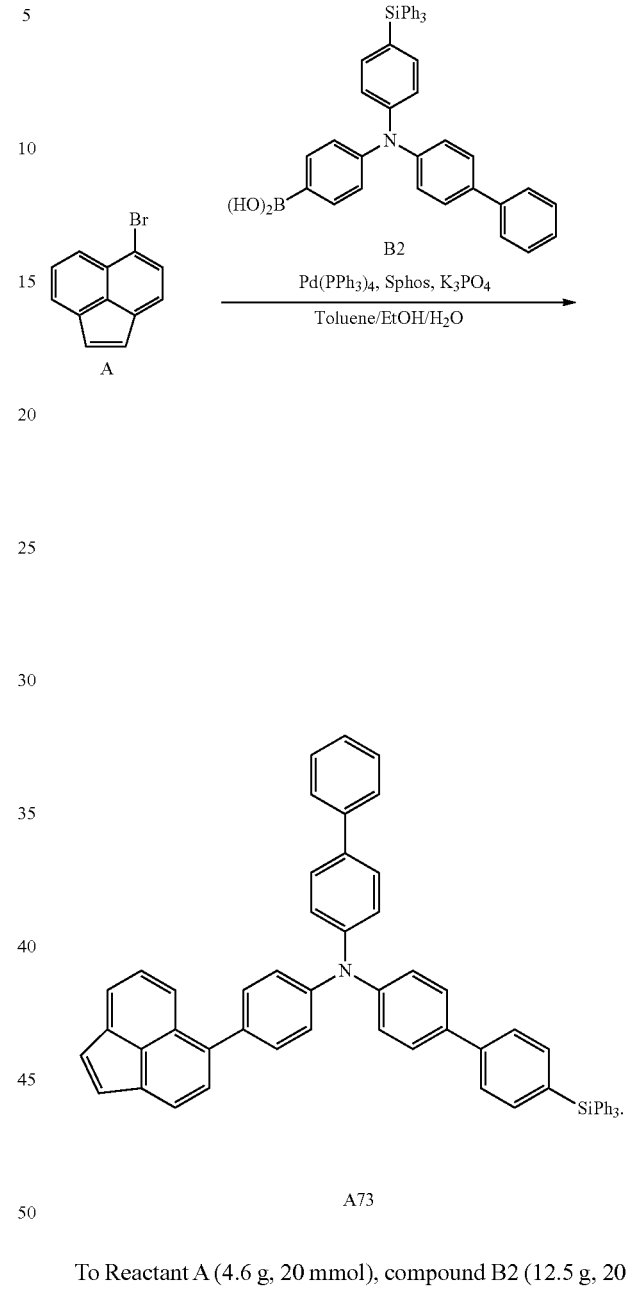

To Reactant A (4.6 g, 20 mmol), compound B2 (12.5 g, 20 mmol), and K$_3$PO$_4$ (8.5 g, 40 mmol), toluene/EtOH/H$_2$O (v/v/v=4/2/1, 250 mL) was added and deaerated. Under an Ar atmosphere, 2-dicyclohexylphosphino-2',6'-dimethoxybiphenyl (1.6 g, 4.0 mmol) and tetrakis(triphenylphosphine)palladium (1.6 g, 1.4 mmol) were added thereto, and heated and stirred at about 85° C. for about 6 hours. The obtained reaction solution was left to cool to room temperature, extracted with toluene, washed with H$_2$O and brine, and dried with anhydrous Na$_2$SO$_4$. The solution thus obtained was concentrated and separated by column chromatography to obtain Compound A73 (10.8 g, 15 mmol, 75%). FAB-MS was measured and mass number, m/z=729.29 was observed by the molecular ion peak, and Compound A73 was confirmed.

7. Synthesis of Compound A41

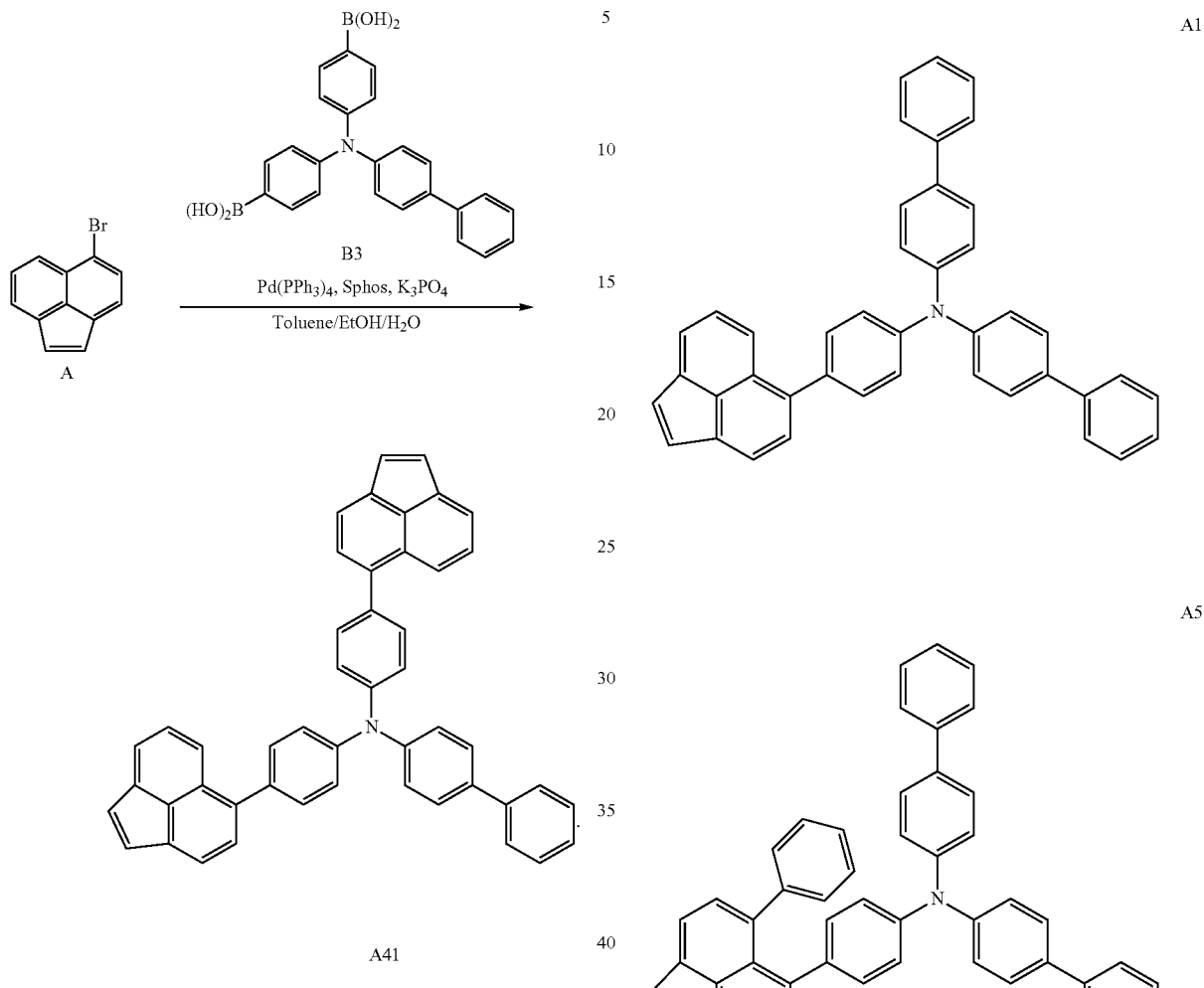

To Reactant A (9.2 g, 40 mmol), compound B3 (8.2 g, 20 mmol), and $K_3PO_4$ (8.5 g, 40 mmol), toluene/EtOH/$H_2O$ (v/v/v=4/2/1, 250 mL) was added and deaerated. Under an Ar atmosphere, 2-dicyclohexylphosphino-2',6'-dimethoxybiphenyl (1.6 g, 4.0 mmol) and tetrakis(triphenylphosphine)palladium (1.6 g, 1.4 mmol) were added thereto, and heated and stirred at about 85° C. for about 6 hours. The obtained reaction solution was left to cool to room temperature, extracted with toluene, washed with $H_2O$ and brine, and dried with anhydrous $Na_2SO_4$. The solution thus obtained was concentrated and separated by column chromatography to obtain Compound A41 (8.7 g, 14 mmol, 69%). FAB-MS was measured and mass number, m/z=621.25 was observed by the molecular ion peak, and Compound A41 was confirmed.

Manufacture of Organic Electroluminescence Device

Organic electroluminescence devices of Examples 1 to 7 were manufactured using the above-described Compounds A1, A5, A12, A17, A33, A73 and A41 as materials for a hole transport region.

Example Compounds

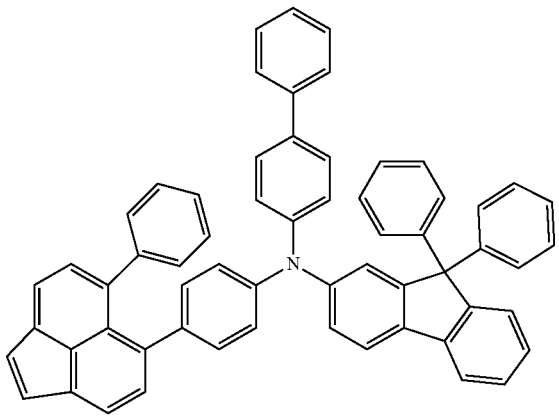

A17
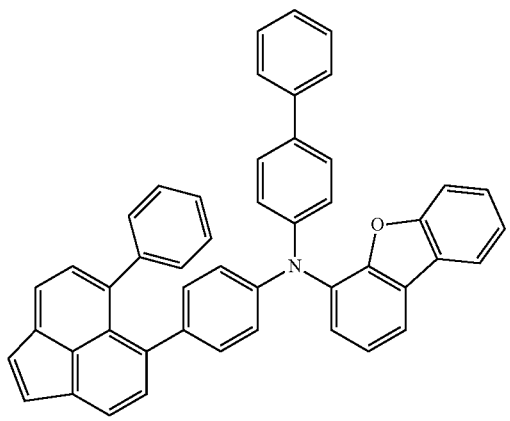
A41
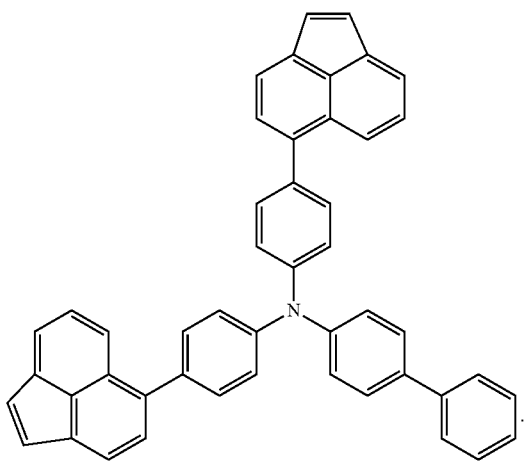
Organic electroluminescence devices of Comparative Examples 1 to 4 were manufactured using Compounds R1 to R4 below as materials for a hole transport region.
Comparative Compounds
A33
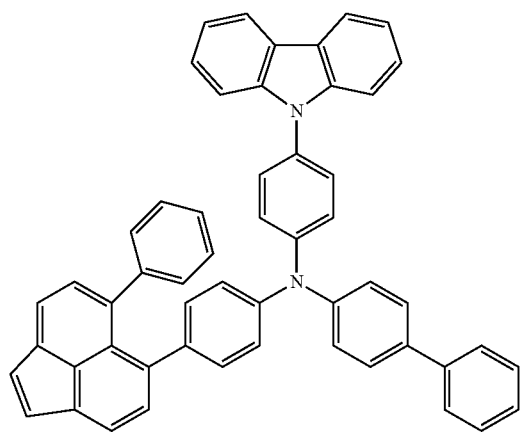
R1
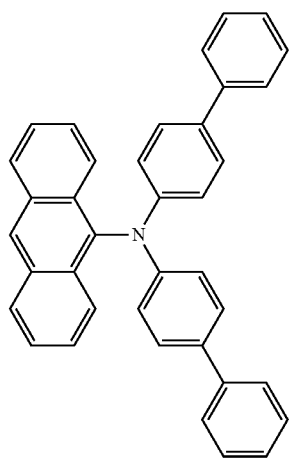
A73
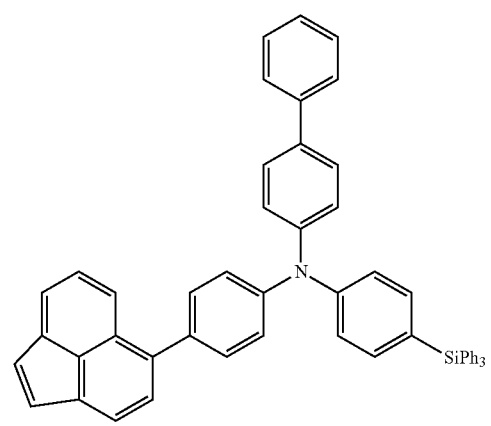
R2
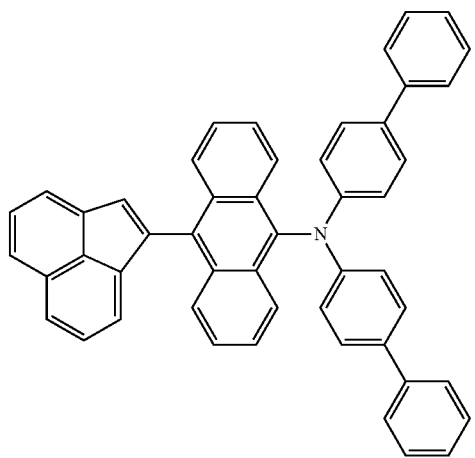

-continued

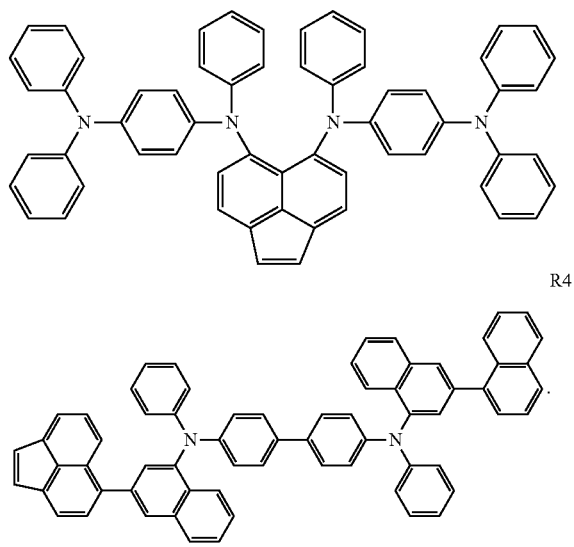

On a glass substrate, ITO was patterned to a thickness of about 150 nm and washed with ultra-pure water, and a UV ozone treatment was conducted for about 10 minutes to form a first electrode. Then, 2-TNANA was deposited to a thickness of about 60 nm, and a hole transport layer was formed using the example compound or the comparative compound to a thickness of about 30 nm. Then, an emission layer was formed to a thickness of about 25 nm using ADN doped with 3% TBP. Then, on the emission layer, a layer was formed using $Alq_3$ to a thickness of about 25 nm, and a layer was formed using LiF to a thickness of about 1 nm to form an electron transport region. Then, a second electrode was formed using aluminum (Al) to a thickness of about 100 nm. All layers were formed by a vacuum deposition method.

The emission efficiency values of the organic electroluminescence devices according to Examples 1 to 7 and Comparative Examples 1 to 4 are listed in Table 1 below. The emission efficiency was measured at about 10 mA/cm$^2$.

TABLE 1

|  | Hole transport layer | Emission efficiency (%) |
| --- | --- | --- |
| Example 1 | Example Compound A1 | 104% |
| Example 2 | Example Compound A5 | 105% |
| Example 3 | Example Compound A12 | 102% |
| Example 4 | Example Compound A17 | 107% |
| Example 5 | Example Compound A33 | 110% |
| Example 6 | Example Compound A73 | 109% |
| Example 7 | Example Compound A41 | 113% |
| Comparative Example 1 | Comparative Compound R1 | 90% |
| Comparative Example 2 | Comparative Compound R2 | 94% |
| Comparative Example 3 | Comparative Compound R3 | 91% |
| Comparative Example 4 | Comparative Compound R4 | 100% |

Referring to Table 1, organic electroluminescence devices of Examples 1 to 7 were found to show improved device efficiency when compared with the devices of Comparative Examples 1 to 4.

In Examples 1 to 7, a deactivation process of an unnecessary excitation state may be restrained by introducing an acenaphthylenyl group into a monoamine compound, and it is thought that the efficiency of a device is largely improved.

In Examples 1, 2 and 6, electronic stabilization is achieved by introducing a phenyl group into an amine group, and the degree of non-crystallinity is improved by introducing a substituent having a sterically large volume, and it is thought that the device properties are improved.

In Examples 3 to 5, an aromatic compound (such as a diphenylfluorenyl group and/or a heteroaromatic compound) is introduced into an amine group, and due to the synergistic effect of the introduced group and an acenaphthylenyl group, it is thought that efficiency is further more improved.

In Example 5, due to the synergistic effect of a carbazole group and an acenaphthylenyl group, it is thought that efficiency is further more improved.

In Example 6, due to the synergistic effect of a phenylsilyl group and an acenaphthylenyl group, it is thought that efficiency is further more improved.

In Example 7, by introducing acenaphthylenyl groups as a disubstituent, it is thought that device properties are further more improved and efficiency is improved.

Comparative Example 1 is found to have lower efficiency than the devices of the Examples. Due to intermolecular energy transfer of an anthracene skeleton in Comparative Compound R1, it is thought that efficiency is decreased.

Comparative Example 2 is found to have lower efficiency than the devices of the Examples. Due to intermolecular energy transfer of an anthracene skeleton in Comparative Compound R2 in which an acenaphthylenyl group is introduced into a molecule, it is thought that efficiency is decreased.

Comparative Example 3 is found to have lower efficiency than the devices of the Examples. Comparative Compound R3 is a tetraamine compound, and due to the stabilization of the highest occupied molecular orbital (HOMO) by the expansion of a molecular orbital in nitrogen atoms and the intermolecular energy transfer in an excited state, it is thought that efficiency is decreased.

Comparative Example 4 is found to have lower efficiency than the devices of the Examples. Comparative Compound R4 is a diamine compound, and due to the expansion of a molecular orbital in two nitrogen atoms and the stabilization of HOMO, it is thought that device efficiency is decreased.

When the distinctive partial structure confirmed in the inventive concept (e.g., the monoamine compound of the inventive concept) is used in a hole transport layer or a position which is adjacent to an emission layer in an organic electroluminescence device, improvement during charge injection and charge transfer processes is thought to be achieved due to an electronic factor and structural stability, and as a result, as confirmed in the Examples, remarkable improvement of device efficiency may be achieved.

The organic electroluminescence device according to one or more embodiments of the inventive concept has excellent efficiency.

The monoamine compound according to one or more embodiments of the inventive concept may be used as a material for a hole transport region of an organic electroluminescence device, and by using the monoamine compound, effects of improving the efficiency of the organic electroluminescence device may be achieved.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present invention have been described, it is understood that the present invention should not be limited to these example embodiments but various changes and modifications can be made by one ordinary skilled in the art within the spirit and scope of the present invention as defined by the following claims and equivalents thereof.

What is claimed is:

1. An organic electroluminescence device, comprising:
   a first electrode;
   a hole transport region on the first electrode;
   an emission layer on the hole transport region;
   an electron transport region on the emission layer; and
   a second electrode on the electron transport region,
   wherein the hole transport region comprises a monoamine compound represented by the following Formula 1:

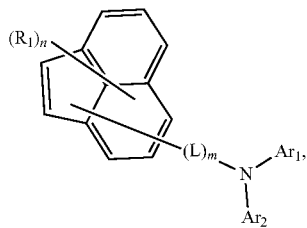

Formula 1 in Formula 1,
$Ar_1$ is substituted or unsubstituted alkyl group of 1 to 10 carbon atoms, a substituted or unsubstituted monocyclic aryl group of 6 to 30 carbon atoms for forming a ring, or a substituted or unsubstituted heteroaryl group of 2 to 30 carbon atoms for forming a ring,
$Ar_2$ is a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring,
L is a substituted or unsubstituted arylene group of 6 to 30 carbon atoms for forming a ring, or a substituted or unsubstituted heteroarylene group of 2 to 30 carbon atoms for forming a ring, where L is not a polyacenylene having three or more rings,
$R_1$ is a hydrogen atom, a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring,
"m" is an integer of 0 to 5,
"n" is an integer of 0 to 7, and
provided that when "m" is 0, "n" is an integer of 1 to 7, and $R_1$ is a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

2. The organic electroluminescence device of claim 1, wherein Formula 1 is represented by the following Formula 2 or Formula 3:

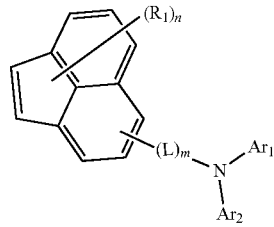

Formula 2

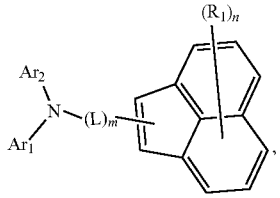

Formula 3 in Formula 2 and Formula 3,
$Ar_1$, $Ar_2$, L, $R_1$, and "m" are the same as defined in Formula 1,
in Formula 2, "n" is an integer of 0 to 5, and
provided that when "m" is 0, "n" is an integer of 1 to 5, and $R_1$ is a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and
in Formula 3, "n" is an integer of 0 to 6, and
provided that when "m" is 0, "n" is an integer of 1 to 6, and $R_1$ is a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

3. The organic electroluminescence device of claim 1, wherein L is a substituted or unsubstituted arylene group of 6 to 12 carbon atoms for forming a ring.

4. The organic electroluminescence device of claim 3, wherein L is a substituted or unsubstituted phenylene group.

5. The organic electroluminescence device of claim 1, wherein $Ar_1$ is a substituted or unsubstituted monocyclic aryl group of 10 to 20 carbon atoms for forming a ring, or a substituted or unsubstituted heteroaryl group of 10 to 20 carbon atoms for forming a ring.

6. The organic electroluminescence device of claim 1, wherein $Ar_2$ is a substituted or unsubstituted aryl group of 10 to 20 carbon atoms for forming a ring, or a substituted or unsubstituted heteroaryl group of 10 to 20 carbon atoms for forming a ring.

7. The organic electroluminescence device of claim 6, wherein Are is a condensed structure with three or more rings.

8. The organic electroluminescence device of claim 1, wherein Formula 1 is represented by the following Formula 4:

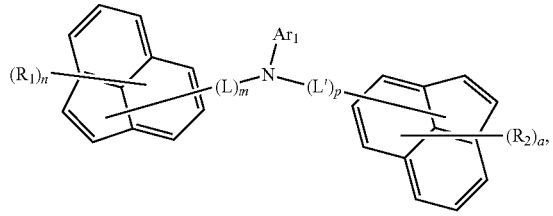

Formula 4 in Formula 4,

L' is a substituted or unsubstituted arylene group of 6 to 30 carbon atoms for forming a ring, or a substituted or unsubstituted heteroarylene group of 2 to 30 carbon atoms for forming a ring, where L' is not a polyacenylene having three or more rings, $R_2$ is a hydrogen atom, a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, "p" is an integer of 0 to 5, "a" is an integer of 0 to 7, and $Ar_1$, L, $R_1$, "m" and "n" are the same as defined in Formula 1.

9. The organic electroluminescence device of claim 1, wherein Formula 1 is represented by the following Formula 6:

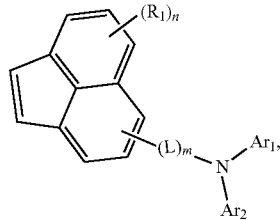

Formula 6 in Formula 6, $Ar_1$, $Ar_2$, L, $R_1$, and "m" are the same as defined in Formula 1, and "n" is an integer of 0 to 3, and provided that when "m" is 0, "n" is an integer of 1 to 3, and $R_1$ is a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

10. The organic electroluminescence device of claim 1, wherein the hole transport region comprises:

a hole injection layer on the first electrode; and a hole transport layer on the hole injection layer, wherein the hole transport layer comprises the monoamine compound represented by Formula 1.

11. The organic electroluminescence device of claim 10, wherein the hole transport region further comprises an electron blocking layer on the hole transport layer.

12. An organic electroluminescence device, comprising:

a first electrode;

a hole transport region on the first electrode;

an emission layer on the hole transport region;

an electron transport region on the emission layer; and a second electrode on the electron transport region, wherein the hole transport region comprises a monoamine compound represented by the following Formula 1:

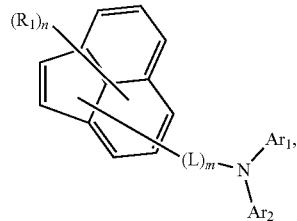

Formula 1 in Formula 1, $Ar_1$ and $Ar_2$ are each independently a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring, where $Ar_1$ and $Ar_2$ are not both condensed structures at the same time, L is a substituted or unsubstituted arylene group of 6 to 30 carbon atoms for forming a ring, or a substituted or unsubstituted heteroarylene group of 2 to 30 carbon atoms for forming a ring, where L is not a polyacenylene having three or more rings, $R_1$ is a hydrogen atom, a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, "m" is an integer of 0 to 5, "n" is an integer of 0 to 7, and provided that when "m" is 0, "n" is an integer of 1 to 7, and $R_1$ is a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

13. The organic electroluminescence device of claim 12, wherein Formula 1 is represented by the following Formula 2 or Formula 3:

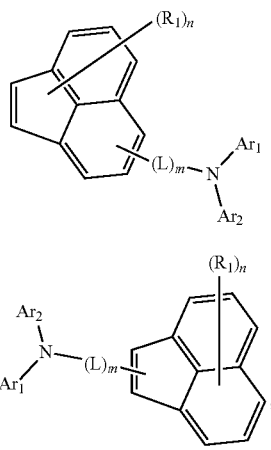

Formula 2

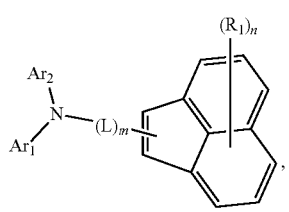

Formula 3 in Formula 2 and Formula 3,

Ar$_1$, Ar$_2$, L, R$_1$, and "m" are the same as defined in Formula 1, in Formula 2, "n" is an integer of 0 to 5, and provided that when "m" is 0, "n" is an integer of 1 to 5, and R$_1$ is a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and in Formula 3, "n" is an integer of 0 to 6, and provided that when "m" is 0, "n" is an integer of 1 to 6, and R$_1$ is a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

14. The organic electroluminescence device of claim 12, wherein Formula 1 is represented by the following Formula 4:

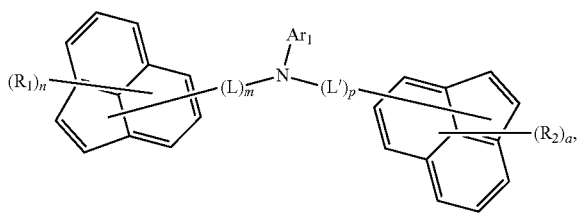

Formula 4 in Formula 4,

L' is a substituted or unsubstituted arylene group of 6 to 30 carbon atoms for forming a ring, or a substituted or unsubstituted heteroarylene group of 2 to 30 carbon atoms for forming a ring, where L' is not a polyacenylene having three or more rings, R$_2$ is a hydrogen atom, a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, "p" is an integer of 0 to 5, "a" is an integer of 0 to 7, and Ar$_1$, L, R$_1$, "m" and "n" are the same as defined in Formula 1.

15. The organic electroluminescence device of claim 12, wherein Formula 1 is represented by the following Formula 6:

Formula 6 in Formula 6,

Ar$_1$, Ar$_2$, L, R$_1$, and "m" are the same as defined in Formula 1, and

"n" is an integer of 0 to 3, and provided that when "m" is 0, "n" is an integer of 1 to 3, and R$_1$ is a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

16. A monoamine compound represented by the following Formula 1:

Formula 1 in Formula 1,

Ar$_1$ is substituted or unsubstituted alkyl group of 1 to 10 carbon atoms, a substituted or unsubstituted monocyclic aryl group of 6 to 30 carbon atoms for forming a ring, or a substituted or unsubstituted heteroaryl group of 2 to 30 carbon atoms for forming a ring, and Ar$_2$ is a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring, L is a substituted or unsubstituted arylene group of 6 to 30 carbon atoms for forming a ring, or a substituted or unsubstituted heteroarylene group of 2 to 30 carbon atoms for forming a ring, where L is not a polyacenylene having three or more rings, R$_1$ is a hydrogen atom, a deuterium atom, a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, provided that $R_1$ is not a bromine atom, "m" is an integer of 0 to 5, "n" is an integer of 0 to 7, and provided that when "m" is 0, "n" is an integer of 1 to 7, and $R_1$ is a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

17. The monoamine compound of claim 16, wherein Formula 1 is represented by the following Formula 2 or Formula 3:

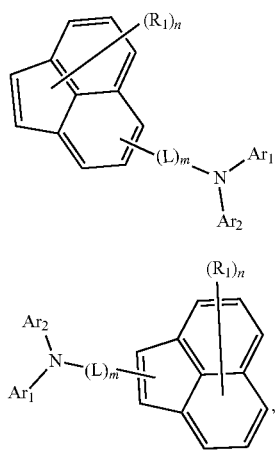

Formula 2

Formula 3 in Formula 2 and Formula 3, $Ar_1$, $Ar_2$, L, $R_1$, and "m" are the same as defined in Formula 1, in Formula 2, "n" is an integer of 0 to 5, and provided that when "m" is 0, "n" is an integer of 1 to 5, and $R_1$ is a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and in Formula 3, "n" is an integer of 0 to 6, and provided that when "m" is 0, "n" is an integer of 1 to 6, and $R_1$ is a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

18. The monoamine compound of claim 16, wherein L is a substituted or unsubstituted arylene group of 6 to 12 carbon atoms for forming a ring.

19. The monoamine compound of claim 16, wherein $Ar_2$ is a condensed structure with three or more rings.

20. The monoamine compound of claim 16, wherein Formula 1 is represented by the following Formula 6:

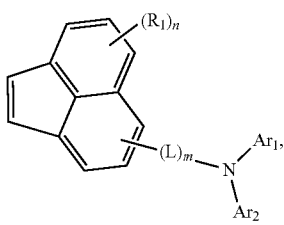

Formula 6 in Formula 6, $Ar_1$, $Ar_2$, L, $R_1$, and "m" are the same as defined in Formula 1, and "n" is an integer of 0 to 3, and provided that when "m" is 0, "n" is an integer of 1 to 3, and $R_1$ is a halogen atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

* * * * *

UNITED STATES PATENT AND TRADEMARK OFFICE
CERTIFICATE OF CORRECTION

PATENT NO.           : 12,022,733 B2  
APPLICATION NO.      : 18/068228  
DATED                : June 25, 2024  
INVENTOR(S)          : Takao Sakuma Page 1 of 1

It is certified that error appears in the above-identified patent and that said Letters Patent is hereby corrected as shown below:

In the Claims

In Column 61, Line 5, in Claim 7, delete "Are" and insert -- $Ar_2$ --.

In Column 63, Lines 46-54, in Claim 14, in Formula 4, delete

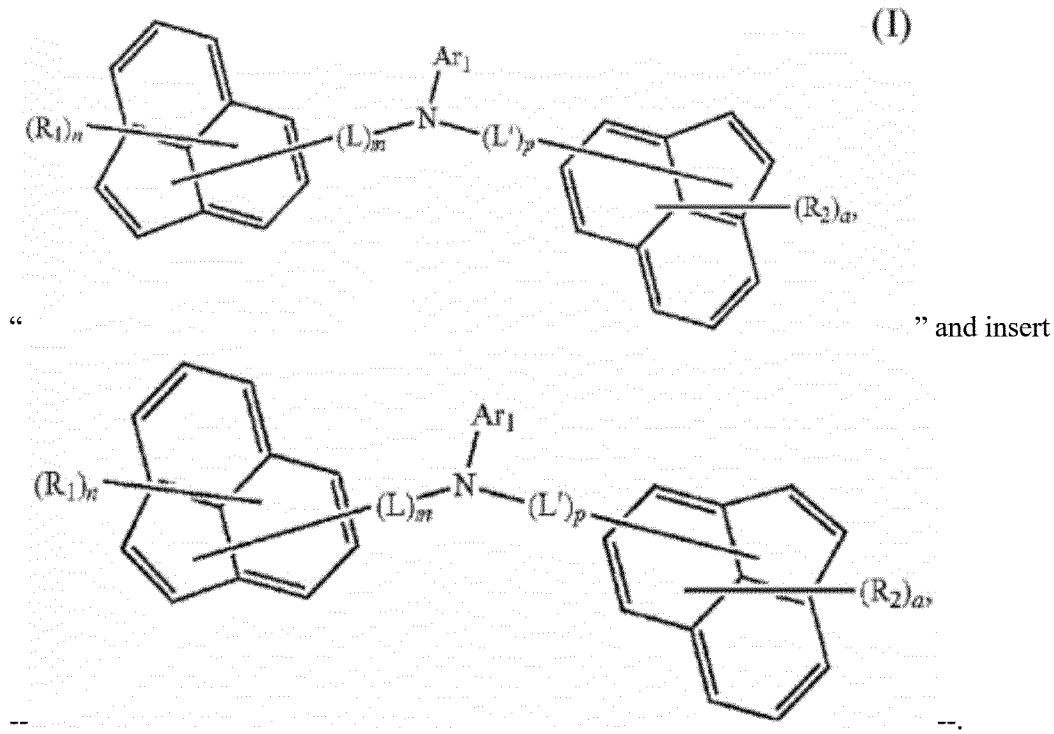

-- .

Signed and Sealed this  
Twenty-sixth Day of November, 2024

*Katherine Kelly Vidal*  
Katherine Kelly Vidal  
*Director of the United States Patent and Trademark Office*